United States Patent
Matsuhashi et al.

(10) Patent No.: US 8,603,840 B2
(45) Date of Patent: Dec. 10, 2013

(54) MANUFACTURING METHOD OF SEMICONDUCTOR DEVICE

(75) Inventors: Jun Matsuhashi, Kanagawa (JP); Naohiro Makihira, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/417,266

(22) Filed: Mar. 11, 2012

(65) Prior Publication Data

US 2012/0244648 A1    Sep. 27, 2012

(30) Foreign Application Priority Data

Mar. 25, 2011 (JP) ................................. 2011-068045

(51) Int. Cl.
- *G01R 31/26* (2006.01)
- *G01R 31/00* (2006.01)
- *G01R 31/08* (2006.01)
- *H01L 21/66* (2006.01)
- *H01L 21/00* (2006.01)

(52) U.S. Cl.
USPC ................. 438/18; 438/14; 438/15; 324/500; 324/525; 324/750.19; 257/E21.002

(58) Field of Classification Search
USPC .................................................... 438/14–18
See application file for complete search history.

(56) References Cited

U.S. PATENT DOCUMENTS

| | | | |
|---|---|---|---|
| 6,072,322 A * | 6/2000 | Viswanath et al. ...... | 324/750.05 |
| 6,359,452 B1 * | 3/2002 | Mozzetta ................. | 324/750.25 |
| 6,748,746 B2 * | 6/2004 | Ono ................................... | 62/3.2 |
| 6,902,410 B2 * | 6/2005 | Watanabe ........................ | 439/66 |
| 6,917,525 B2 * | 7/2005 | Mok et al. ...................... | 361/767 |
| 7,245,137 B2 * | 7/2007 | Eldridge et al. .......... | 324/754.07 |
| 7,262,615 B2 * | 8/2007 | Cheng et al. ............. | 324/756.05 |
| 7,598,756 B2 | 10/2009 | Inoue et al. | |
| 7,737,710 B2 * | 6/2010 | Cho .......................... | 324/756.02 |
| 7,785,114 B2 * | 8/2010 | Brist et al. ...................... | 439/71 |
| 7,837,481 B1 * | 11/2010 | Mahoney et al. ................ | 439/81 |
| 7,884,630 B2 * | 2/2011 | Osato et al. .............. | 324/756.02 |
| 8,242,794 B2 * | 8/2012 | Cho .......................... | 324/754.03 |
| 8,269,516 B1 * | 9/2012 | Mardi et al. ............. | 324/754.09 |
| 2001/0000765 A1 * | 5/2001 | Fukunaga ..................... | 439/342 |
| 2005/0225346 A1 * | 10/2005 | Saito et al. ..................... | 324/760 |
| 2008/0054261 A1 * | 3/2008 | Song et al. ...................... | 257/48 |
| 2009/0017703 A1 * | 1/2009 | Takahashi et al. ............ | 439/824 |
| 2010/0231248 A1 * | 9/2010 | Cho .............................. | 324/755 |
| 2010/0231251 A1 * | 9/2010 | Nelson et al. ................. | 324/761 |
| 2010/0327879 A1 * | 12/2010 | Yasuzawa ..................... | 324/537 |
| 2012/0235695 A1 * | 9/2012 | Cho ......................... | 324/750.25 |

FOREIGN PATENT DOCUMENTS

| | | | |
|---|---|---|---|
| JP | 2007-163463 A | | 6/2007 |
| JP | 2009-20105 A | | 1/2009 |

* cited by examiner

*Primary Examiner* — Seahvosh Nikmanesh
*Assistant Examiner* — Evren Seven
(74) *Attorney, Agent, or Firm* — Miles & Stockbridge P.C.

(57) ABSTRACT

To improve the reliability in an electric inspection of a semiconductor device. When a movable pedestal 15 is being positioned relative to an arrangement direction of a plurality of second contact pins 13*a* by a positioning pin 13*b* which a socket 12 includes, a substrate conduction test is performed by bringing a first contact pin 14*a* into contact with a pre-stack land 5*c* of a wiring substrate 5 and of the a lower package 2 and moreover bringing the second contact pin 13*a* into contact with a solder ball 7, and thus the electric inspection can be performed by precisely positioning the first contact pin 14*a* side and the second contact pin 13*a* side. Then, the reliability of the electric inspection can be improved.

12 Claims, 22 Drawing Sheets

| | | | VALUES USED IN SIMULATION |
|---|---|---|---|
| LOWER PACKAGE | a | PRE-STACK LAND DIAMETER | 0.325 |
| | b | BALL DIAMETER | 0.300 |
| | c | DEVIATION BETWEEN FRONT AND BACK SIDES | 0.127 |
| SOCKET | d | BALL GUIDE DIAMETER | 0.368 |
| | e | PIN GUIDE DIAMETER | 0.278 |
| | f | PIN DIAMETER | 0.242 |
| | g | LOWER POSITIONING PIN INNER DIAMETER | 3.004 |
| | h | UPPER POSITIONING PIN DIAMETER | 2.995 |
| | m | LOWER POSITIONING PIN PORE DIAMETER | 4.572 |
| | n | LOWER POSITIONING PIN OUTER DIAMETER | 4.492 |

FIG. 19

| | | | VALUES USED IN SIMULATION |
|---|---|---|---|
| LOWER PACKAGE | a | PRE-STACK LAND DIAMETER | 0.325 |
| | b | BALL DIAMETER | 0.300 |
| | c | DEVIATION BETWEEN FRONT AND BACK SIDES | 0.127 |
| SOCKET | d | BALL GUIDE DIAMETER | 0.366 |
| | e | PIN GUIDE DIAMETER | 0.276 |
| | f | PIN DIAMETER | 0.244 |
| | g | LOWER POSITIONING PIN INNER DIAMETER | 3.004 |
| | h | UPPER POSITIONING PIN DIAMETER | 2.996 |
| | j | PEDESTAL LOWER POSITIONING PART | 32.219 |
| | k | PEDESTAL POSITIONING PART | 31.981 |
| | i | POSITIONING ACCURACY OF LOWER POSITIONING PIN | 0.019 |

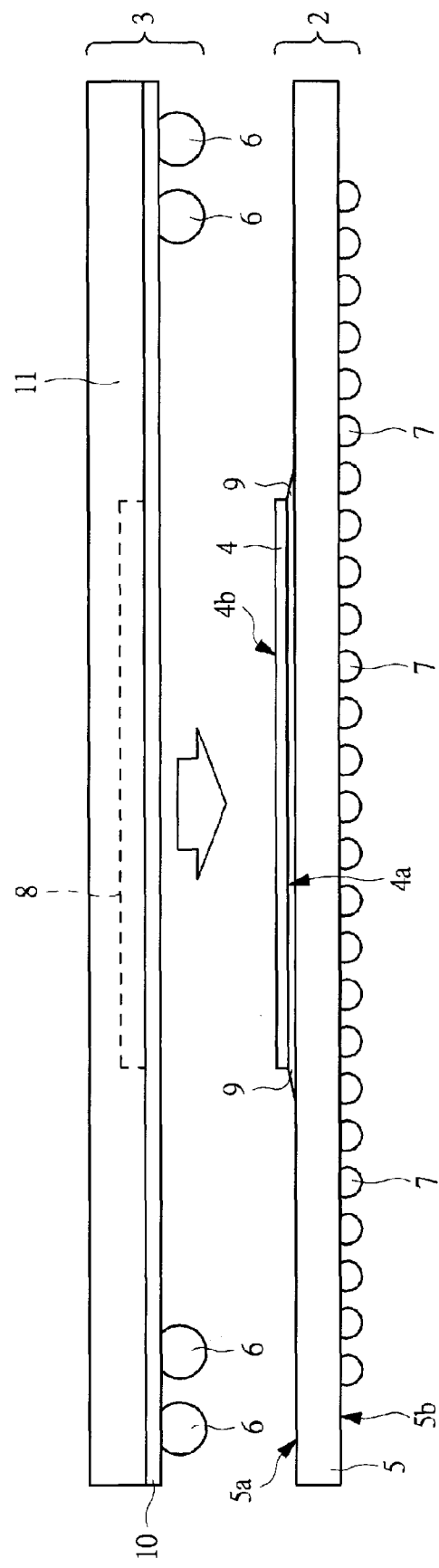

MANUFACTURING METHOD OF SEMICONDUCTOR DEVICE

CROSS-REFERENCE TO RELATED APPLICATION

The disclosure of Japanese Patent Application No. 2011-68045 filed on Mar. 25, 2011 including the specification, drawings and abstract is incorporated herein by reference in its entirety.

BACKGROUND

The present invention relates to a manufacturing technology for semiconductor devices, and in particular relates to a technology effective in improving the reliability in an electric inspection which is performed when a semiconductor device is being mounted on a socket.

Japanese Patent Laid-Open No. 2007-163463 (Patent Document 1) discloses a structure, in which in the inspection of a semiconductor integrated circuit, an external electrode on a first side of the semiconductor integrated circuit is electrically connected to an inspection wiring substrate via a first conductive contact while an external electrode on a second side of the semiconductor integrated circuit is electrically connected to the inspection wiring substrate via a second conductive contact, a wiring substrate, and a third conductive contact; and a technique for inspection by using this structure.

Moreover, Japanese Patent Laid-Open No. 2009-20105 (Patent Document 2) discloses a technique for simultaneously inspecting a connection state of a connection terminal provided on the lower surface of an object to be inspected and a connection state of a connection terminal provided on the upper surface.

SUMMARY

In semiconductor devices with a semiconductor integrated circuit and the like incorporated, in addition to a reduction in size of an electronic device on which this semiconductor device is mounted, an enhancement in performances of the electronic device is also progressing significantly. Therefore, also for the semiconductor device, there is a need for a semiconductor device achieving both a reduction in size and an enhancement in performances.

As a semiconductor device achieving a reduction in size and an enhancement in performances, a package on package (POP), which is a stacked semiconductor package, is known.

Because the POP includes an upper package mounted over a lower package, both the lower and upper packages are generally substrate-type semiconductor packages. In the lower package and the upper package, a ball electrode such as a solder ball is arranged between the wiring substrates, and via this ball electrode the upper and lower packages are electrically connected to each other.

Accordingly, around a semiconductor chip on the upper surface (front-side surface) of the wiring substrate of the lower package, a plurality of pre-stack lands which are the electrodes for connecting to the upper package is provided. On the lower surface (back-side surface) of the wiring substrate, a plurality of back-side lands for the connection to solder balls serving as the external terminals of the POP. The back-side lands are arranged in a grid pattern, as with a ball grid array (BGA) or the like.

As described above, the wiring substrate of the lower package of the POP includes the pre-stack lands on its front-side surface. On the back-side surface, it includes the back-side lands (hereinafter, also referred to as BGA lands).

Moreover, in the assembly of the POP, after the upper and lower packages are separately assembled and separately inspected, the POP is completed by stacking the non-defective packages. Then, the yield improves.

Accordingly, in the assembly of the lower package, the lower package is completed after a plurality of heating processes such as a reflow process for mounting a solder ball serving as an external terminal.

However, due to the thermal history caused by the influence of various heating processes during assembly, a part of the wiring or via inside a substrate becomes highly resistive (be partially disconnected) or may be disconnected.

For these defects, in an electric inspection performed when an assembled lower package is being mounted on a socket, a disconnection defect between a BGA land and a semiconductor chip can be detected by bringing a contact pin into contact with a solder ball (external terminal). With regard to a disconnection defect between a pre-stack land and a semiconductor chip, it is impossible to detect by bringing a contact pin into contact from the solder ball side.

For this reason, a disconnection defect between a pre-stack land and a semiconductor chip is also detected by bringing a contact pin into contact with the pre-stack land as well.

As described above, in the electric inspection of the POP, because a contact pin has to be brought into contact with both a solder ball on the back side and a pre-stack land on the front side at the same time, it is important to position the both with high accuracy.

If the position of a solder ball (on the back side) and that of a pre-stack land (on the front side) deviate from each other, the inspection cannot be normally performed. Furthermore, a contact pin may damage the solder resist in a wiring substrate, or in the worst case, a contact pin may damage the wiring.

The present inventor has examined the electric inspection of a POP, using a socket, and has identified the following problems. FIG. 24 is a partial sectional view showing the structure of a socket of a first comparative example the present inventor examined for comparative example. FIG. 25 is a partial sectional view showing the structure of a socket of a second comparative example the present inventor examined for comparative example.

A socket 50 of the first comparative example in FIG. 24 includes a base section 51 and a lid section 53. The base section 51 has a contact pin 54. The lid section 53 has a contact pin 57. The base section 51 and the lid section 53 are positioned by a positioning pin 58 and a fitting portion 59.

Moreover, in the socket 50, in a concave portion 56 placing a lower package 52 of the base section 51 in, a plurality of contact pins 54 among all pins projects like a pinholder. During inspection, the lower package 52 is dropped under its own weight from the above to the contact pins 54 and placed in the concave portion 56. Therefore, if the position of the solder ball 55 slightly deviates from that of the contact pin 54, the contact pin 54 does not contact the solder ball 55 but directly contacts the wiring substrate 60, resulting in a problem in which the solder resist in the wiring substrate 60 is damaged.

Furthermore, a problem also occurs, in which the solder ball 55 is damaged by an impact caused when the solder ball 55 contacts the contact pin 54 in dropping the lower package 52 under its own weight.

Then, a socket devised as a countermeasure against the above-mentioned problem is a socket 61 of the second comparative example in FIG. 25. The socket 61 includes the base section 51 and the lid section 53 as with the socket 50. The base section 51 has the contact pin 54. The lid section 53 has the contact pin 57. The base section 51 and the lid section 53 are positioned by positioning the positioning pin 58 and the fitting portion 59.

Furthermore, in the base section 51 of the socket 61, the pedestal 62 for placing the lower package 52 in during inspection is provided. On a package placement surface of the pedestal 62, a groove portion, in which the solder ball 55 of the lower package 52 is placed, is provided in a one-to-one relationship with the solder ball 55, corresponding to all the solder balls 55, in which in each groove portion, each contact pin 54 is arranged such that a tip portion of the contact pin 54 can project from the lower side of this groove portion.

The pedestal 62 is supported by the base section 51 via an elastic member 63. When the lid section 53 of the socket 61 is closed after placing the lower package 52 in the pedestal 62 during inspection, the lower package 52 is pressed from the above by the lid section 53 and the pedestal 62 is also pressed downward along with the lower package 52, and the contact pin 54 projects into the groove portion and contacts the solder ball 55. When each solder ball 55 is placed in each groove portion, the contact pin 54 has not projected yet into the groove portion. The solder ball 55 does not contact the contact pin 54 and the damaging of the solder ball 55 can be reduced.

Furthermore, because the contact pin 54 contacts the solder ball 55 after placing the solder ball 55 in the groove portion, it is possible to prevent the contact pin 54 from bumping against a solder resist in the wiring substrate 60 due to a positional deviation and is also possible to prevent the solder resist from being damaged.

However, a problem occurs. The pedestal 62 of the socket 61 is not positioned relative to the arrangement direction of the contact pins 54. If the position of the contact pin 57 on the front side and that of a pre-stack land 60*a* deviate from each other, the contact pin 57 does not contact the pre-stack land 60*a* but contacts the solder resist in the wiring substrate 60, resulting in a problem in which the solder resist is damaged.

Another problem also occurs. The electric inspection is not normally performed because the contact pin 57 does not contact the pre-stack land 60*a*.

The present invention has been made in view of the above circumstances and provides a technique capable of improving the reliability in the electric inspection of a semiconductor device.

The present invention also provides a technique capable of increasing the positioning accuracy between a semiconductor device and a contact pin in the electric inspection of the semiconductor device.

The other purposes and the new feature of the present invention will become clear from the description of the present specification and the accompanying drawings.

The following explains briefly the outline of a typical invention among the inventions disclosed in the present application.

A method of manufacturing a semiconductor device according to a typical embodiment includes the steps of (a) assembling a semiconductor device by mounting a semiconductor chip over a front-side surface of a wiring substrate including a front-side pad on the front-side surface and a back-side pad on a back-side surface, the front-side pad and the back-side pad being electrically connected to each other, and also mounting a solder ball on the back-side pad; (b) inserting the semiconductor device into a socket to bring a contact pin provided inside the socket into contact with the front-side pad and the solder ball; and (c) performing a conduction test of the wiring substrate via the contact pin. The socket includes a movable pedestal capable of placing the semiconductor device on, a base section arranged under the movable pedestal, and a lid section which is arranged above the semiconductor device during the conduction test. The lid section includes a positioning pin and a first contact pin contacting the front-side pad. The base section includes a second contact pin contacting the solder ball and a positioning member engaging with the positioning pin. The movable pedestal fits into the positioning member, and is provided movably along an extending direction of the contact pin under a guidance of the positioning member. The conduction test of the step (c), when the movable pedestal is being positioned relative to an arrangement direction of the contact pin by the positioning member, is performed while bringing the first contact pin into contact with the front-side pad and also causing the second contact pin to penetrate the base section and bringing the second contact pin into contact with the solder ball.

The following explains briefly the effect acquired by the typical invention among the inventions disclosed in the present application.

The reliability in the electric inspection of a semiconductor device can be improved.

Moreover, the quality of a semiconductor device can be improved.

BRIEF DESCRIPTION OF THE DRAWINGS

FIG. 19 is a data diagram showing the values used in a simulation of the contact position of a contact pin in the major portion of the socket in FIG. 18.

FIG. 20 is an external view showing an assembly of the POP in FIG. 1.

DETAILED DESCRIPTION

In the following embodiments, the explanation of the same or similar portions is omitted, as a principle, unless otherwise particularly necessary.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements (including the number, a numeric value, an amount, and a range), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step) is not necessarily indispensable, except for the case where it is clearly specified in particular and where it is considered to be clearly indispensable from a theoretical point of view.

Moreover, in the following embodiments, when described as "comprises A", "comprising A", "having A", or "including A" with regard to an element or the like, it is needless to say that unless stated explicitly when "comprising only a specific element", elements other than this element are not excluded. Similarly, in the following embodiments, when shape, position relationship of an element are referred to, what resembles or is similar to the shape substantially shall be included, except for the case where it is clearly specified in particular and where it is considered to be clearly not right from a theoretical point of view. This statement also applies to the numeric value and range described above.

Hereinafter, the embodiments of the present invention will be described in detail with reference to the accompanying drawings. In all the drawings for explaining embodiments, the same symbol is attached to the same member having the same function, and the repeated explanation thereof is omitted.

Embodiments

Figure 1:
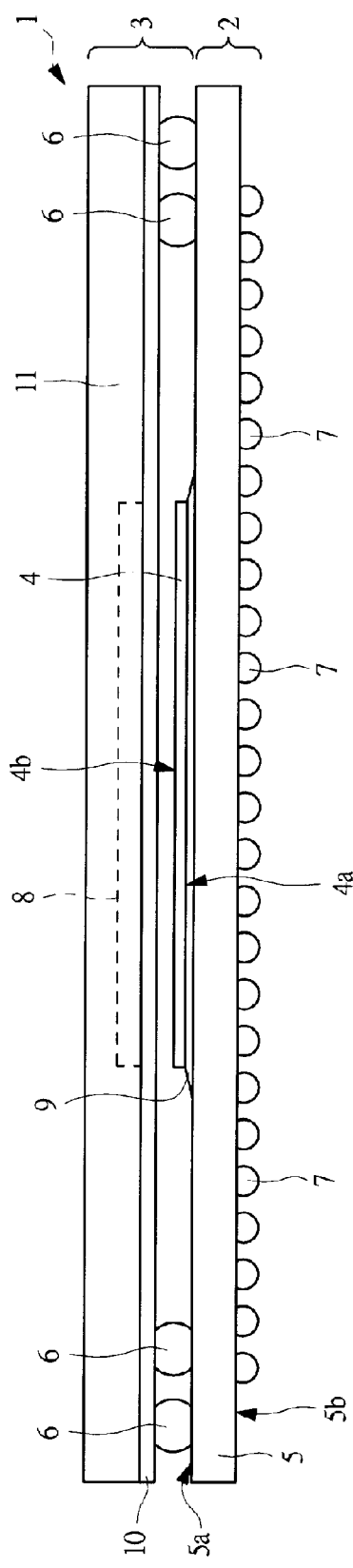
FIG. 1 is a side view showing a structure of a POP assembled by a method of manufacturing a semiconductor device in accordance with an embodiment of the present invention.
Figure 2:
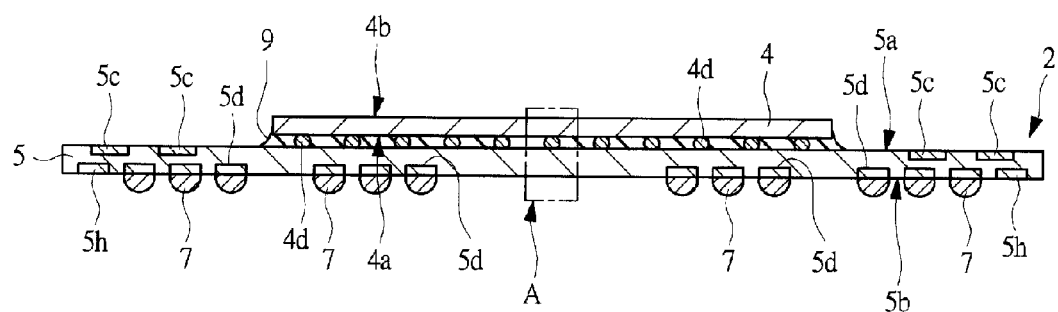
FIG. 2 is a cross-sectional view showing a structure of a lower package of the POP in FIG. 1.
Figure 3:
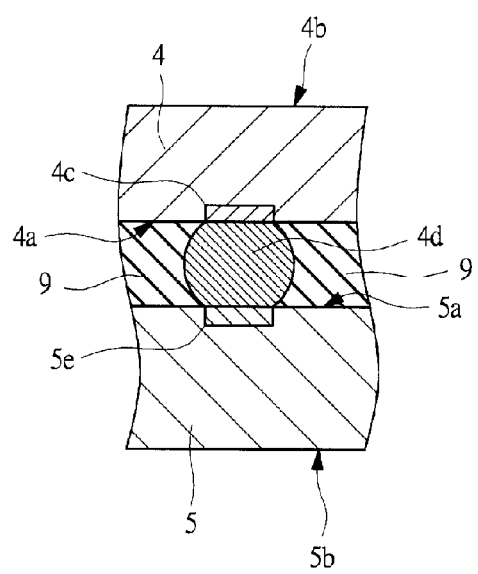
FIG. 3 is an enlarged partial cross-sectional view showing the structure of an "A" portion in FIG. 2.
Figure 4:
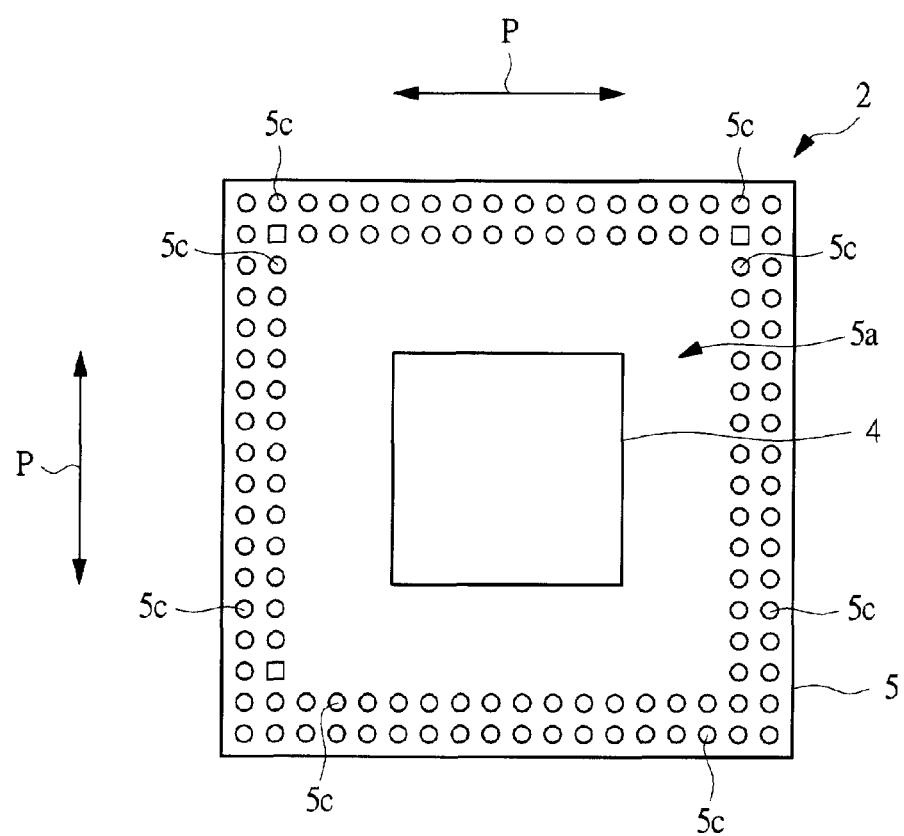
FIG. 4 is a plan view showing a structure of the lower package shown in FIG. 2.
Figure 5:
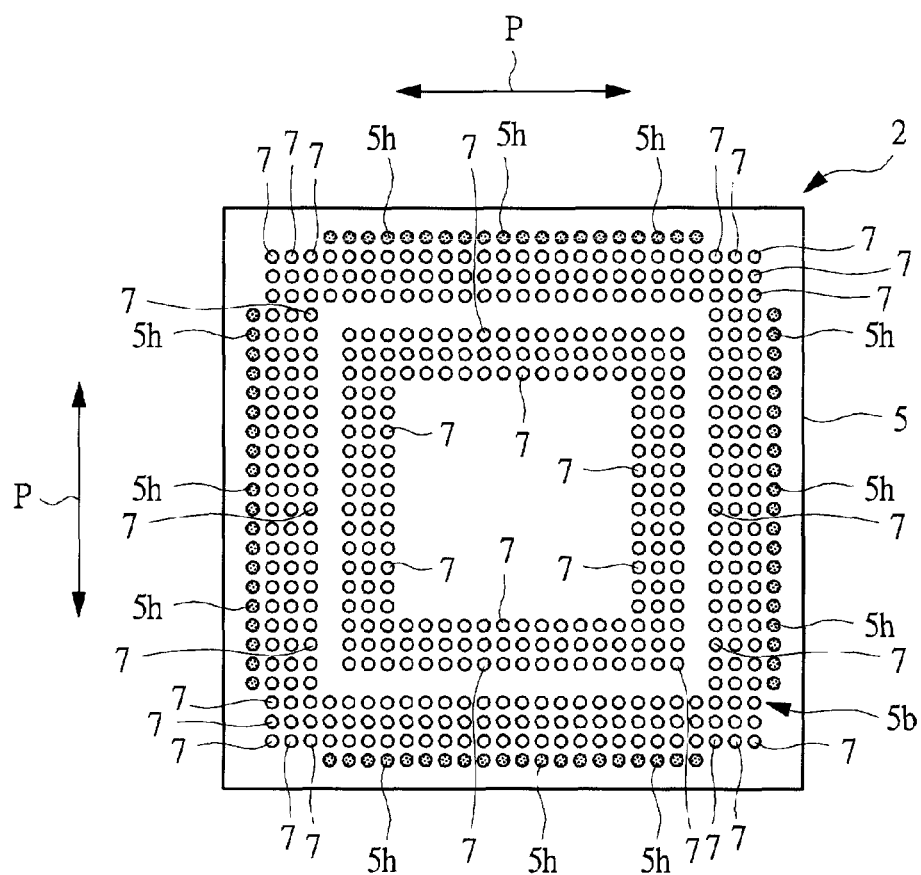
FIG. 5 is a back side view showing a structure of the lower package in FIG. 2.

FIG. 1 is a side view showing a structure of a POP assembled by a method of manufacturing a semiconductor device in accordance with an embodiment of the present invention. FIG. 2 is a cross-sectional view showing a structure of a lower package of the POP in FIG. 1. FIG. 3 is an enlarged partial cross-sectional view showing the structure of an "A" portion in FIG. 2. FIG. 4 is a plan, view showing a structure of the lower package in FIG. 2. FIG. 5 is a back side view showing a structure of the lower package in FIG. 2.

A semiconductor device of the embodiment is used on the lower side of a package on package (POP) including two semiconductor packages stacked in two stages via a solder ball. As a semiconductor device, a ball grid array (BGA)-type lower package 2 will be described, in which a plurality of ball electrodes serving as the external terminals of the POP is provided on the back side of a wiring substrate.

FIG. 1 shows a POP1 in accordance with the embodiment. An upper package 3 is stacked over a lower package 2 via a solder ball 6 and thus both the lower package 2 and the upper package 3 are substrate-type semiconductor packages.

In the lower package 2, a semiconductor chip 4 is mounted over the wiring substrate 5, the semiconductor chip 4 and the wiring substrate 5 are electrically connected to each other by flip-chip bonding as shown in FIG. 2, and a flip-chip bonding portion is sealed by an underfill 9. As shown in FIG. 3, on the upper surface (front-side surface) 5a of the wiring substrate 5, the semiconductor chip 4 is face-down mounted via a bump electrode 4d which is a projection electrode, in which an electrode pad 4c formed on a major surface 4a of the semiconductor chip 4 and a chip land (chip bonding pad) 5e formed on an upper surface 5a of the wiring substrate 5 are electrically connected to each other via the bump electrode 4d. Moreover, a void between the wiring substrate 5 and the semiconductor chip 4 is filled with the underfill 9 for protection of the flip-chip bonding portion.

In contrast, as shown in FIG. 1, in the upper package 3, the semiconductor chip 8 is mounted over the wiring substrate 10, and the semiconductor chip 8 and the wiring substrate 10 are electrically connected to each other by wire bonding, bump bonding, or the like. Furthermore, the semiconductor chip 8 is resin-sealed with a sealant 11 including a sealing resin.

In the POP1, the solder ball 6 is arranged between the respective wiring substrates 5 and 10 of the lower package 2 and the upper package 3, and via the solder ball 6, the upper and lower packages are electrically connected to each other. Accordingly, the height of a semiconductor chip portion of the lower package 2 has to be lowered than that of the solder ball 6 arranged around. As a result, in the lower package 2, the back-side surface 4b (upper-side surface) of the flip-chip bonded semiconductor chip 4 is exposed.

Moreover, as shown in FIG. 4, around the semiconductor chip 4 on the upper surface 5a of the wiring substrate 5 of the lower package 2 (in the peripheral portion of the upper surface 5a of the wiring substrate 5), a plurality of pre-stack lands (surface pads) 5c which are the electrodes for connecting to the upper package 3 is provided. As shown in FIG. 2 and FIG. 5, on the lower surface (back-side surface) 5b, a plurality of external-terminal lands 5d for connecting the solder ball 7 serving as external terminals of the POP1 (back-side pad) is provided. Moreover, a land grid array (LGA) land 5h may be provided in the outermost periphery and the like.

The external-terminal lands 5d are arranged in a grid pattern, as with BGA or the like. However, in the lower package 2 in accordance with the embodiment, the external-terminal land 5d and the solder ball 7 are not provided in the region under the chip.

Next, the assembly of the lower package 2 which is the semiconductor device of the embodiment will be described.

Figure 6:
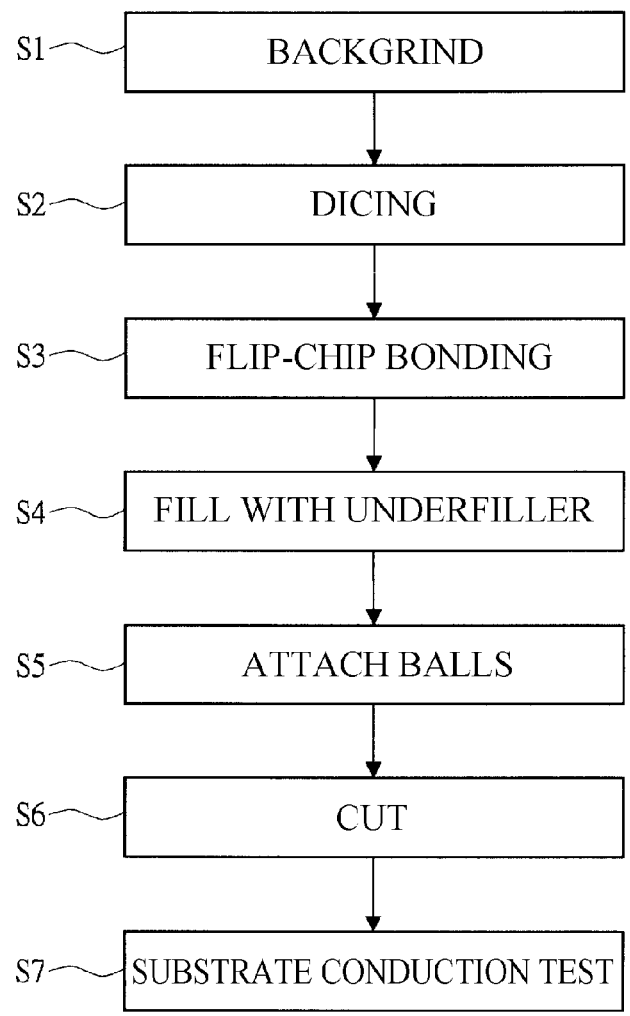
FIG. 6 is a flow diagram showing an assembly procedure of the lower package in FIG. 2.
Figure 7:
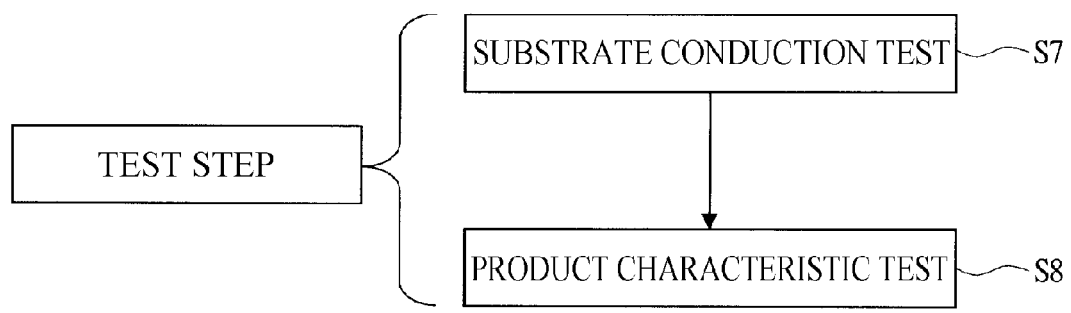
FIG. 7 is a flow diagram showing a test step in assembly of the lower package in FIG. 2.

FIG. 6 is a flow diagram showing an assembly procedure of the lower package in FIG. 2. FIG. 7 is a flow diagram showing a test step in assembly of the lower package in FIG. 2.

First, back grinding shown in Step S1 in FIG. 6 is performed. The back-side surface of a semiconductor wafer not shown is polished and the semiconductor wafer is set to have a desired thickness.

Subsequently, by performing dicing in Step S2 to singulate the semiconductor wafer, the semiconductor chip 4 for the lower package is obtained.

Subsequently, flip-chip bonding of Step S3 is performed. First, as shown in FIG. 2 and FIG. 3, the wiring substrate 5 is prepared, the wiring substrate 5 including the pre-stack lands 5c and the chip land 5e on the upper surface 5a and furthermore the external-terminal lands 5d on the lower surface 5b, in which the pre-stack land 5c and the external-terminal land 5d are electrically connected to each other via an internal wiring 5f, a via 5g, or the like in FIG. 11 described later.

Subsequently, the semiconductor chip 4 is flip-chip bonded onto the wiring substrate 5. The semiconductor chip 4 is electrically connected to the chip land 5e electrically connected to the pre-stack land 5c. At this time, the bump electrode 4d including a solder and the like provided on the surface of the electrode pad 4c of the semiconductor chip 4 is electrically connected to the chip land 5e on the upper surface 5a of the wiring substrate 5.

The bump electrode 4d and the chip land 5e of the wiring substrate 5 are connected by melting a solder, which is provided in the chip land 5e in advance, by heating the semiconductor chip 4. At this time, a thermal stress is applied to the wiring substrate 5 as well.

After the flip-chip bonding is completed, the filling of underfill of Step S4 in FIG. 6 is performed. As shown in FIG. 3, by applying the underfill 9 which is an insulative resin to fill the void between the semiconductor chip 4 and the wiring substrate 5 and to fill the peripheral of each bump electrode 4d (the peripheral of the flip-chip bonding portion), the flip-chip bonding portion is protected (reinforced).

Subsequently, solder ball mounting of Step S5 in FIG. 6 is performed. Here, high temperature reflow is performed with the solder ball 7 mounted on the external-terminal land 5d on the lower surface 5b of the wiring substrate 5, thereby coupling the solder ball 7 to the external-terminal land 5d as shown in FIG. 2. Therefore, also in the solder ball mounting step, a thermal stress is applied to the wiring substrate 5.

Subsequently, cutting in Step S6 in FIG. 6 is performed. The wiring substrate 5 is cut (singulated) and then assembling into each lower package 2 is completed.

After the assembly is completed, a substrate conduction test in Step S7 is performed.

FIG. 7 shows the test step after the assembly of the lower package 2 which is the semiconductor device. Further, in the substrate conduction test of Step S7, conduction test of the wiring substrate 5 in the lower package 2 is performed, and a product characteristic test in Step S8 is performed only on the lower package 2 which has been determined to be non-defective in this conduction test.

The importance of the substrate conduction test of Step S7 in the lower package 2 constituting the POP1 will be described.

Since the POP1 includes the upper package 3 stacked via the solder ball 6 over the lower package 2, as described above, the pre-stack land 5c is provided on the upper surface 5a side of the wiring substrate 5 the lower package 2 includes, while on the lower surface 5b side, the external-terminal land 5d is provided. The pre-stack land 5c and the external-terminal land 5d are electrically connected to each other by the internal wiring 5f, the via 5g, and the like shown in FIG. 11.

However, in the assembly of the lower package 2, due to the thermal history in the flip-chip bonding step and in the solder ball mounting step described above, a part of the internal wiring 5f or via 5g of the wiring substrate 5 may become highly resistive (be partially disconnected) or be disconnected. Then, a disconnection defect between the external-terminal land 5d and the semiconductor chip 4 can be detected by bringing probe (contact pin) into contact with the solder ball 7 which is the external terminal. However, because a disconnection defect between the external-terminal land 5d and the pre-stack lands 5c (between the pre-stack land 5c and the semiconductor chips 4) cannot be detected from the solder ball 7 side of the lower surface 5b, a disconnection defect between the external-terminal land 5d and the pre-stack land 5c (between the pre-stack land 5c and the semiconductor chips 4) is also tested by bringing a probe into contact with the pre-stack land 5c as well.

As described above, in the assembly of the POP1, a defective product can be identified and removed by performing the conduction test of the wiring substrate 5 that is subjected to a thermal history in the assembly of the lower package 2, and the yield of the POP1 can be improved by combining only the non-defective lower package 2 with the upper package 3, and thus the substrate conduction test is of great significance.

Moreover, as described above, in the substrate conduction test of great significance after the assembly of the lower package 2 of the POP1, a test probe (contact pin) must be contacted to both the solder ball 7 on the lower surface 5b side of the wiring substrate 5 and the pre-stack land 5c on the upper surface 5a side, and thus the positioning needs to be performed on the both sides precisely.

Next, the substrate conduction test of Step S7 in FIG. 7 (FIG. 6) will be described.

Figure 8:
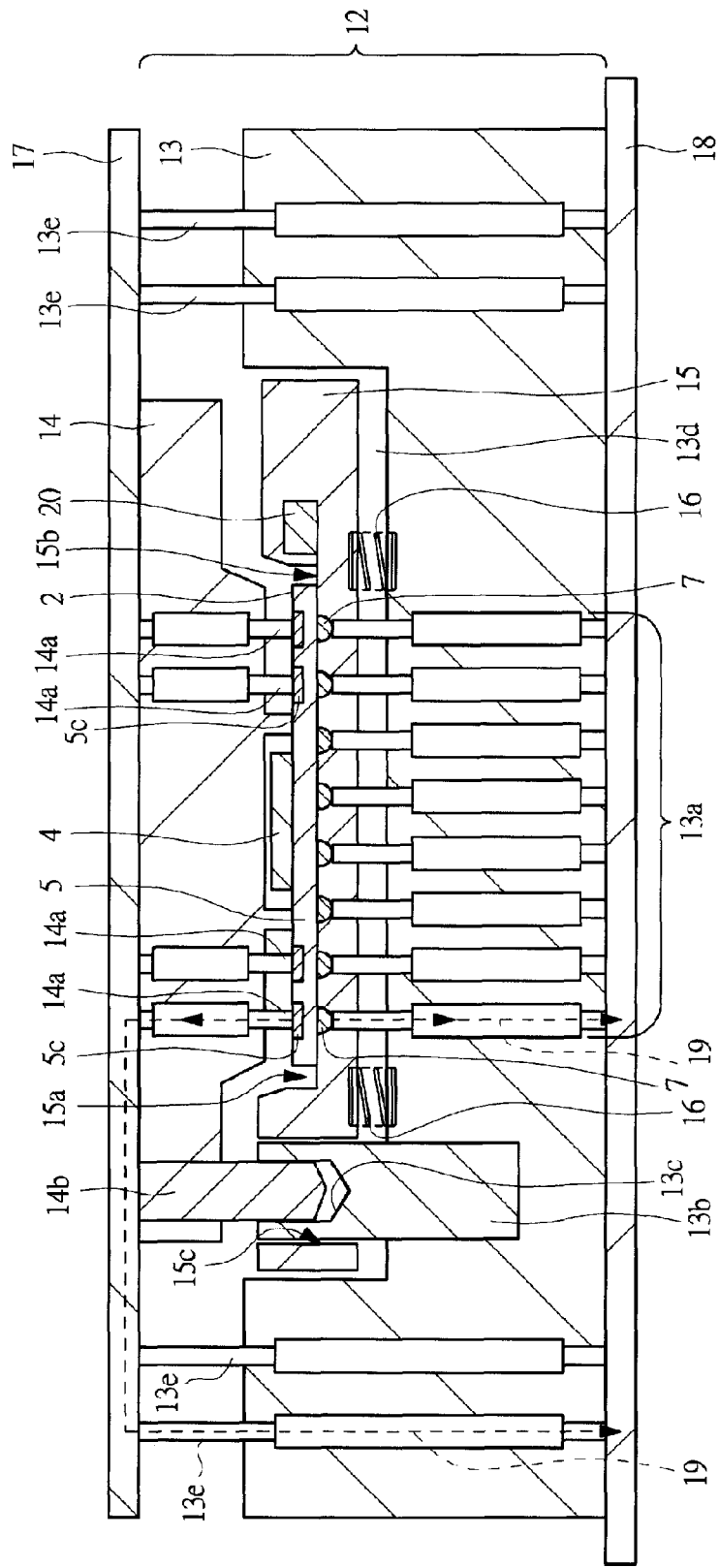
FIG. 8 is a cross-sectional view showing a structure of a socket used in the test step in FIG. 7.
Figure 9:
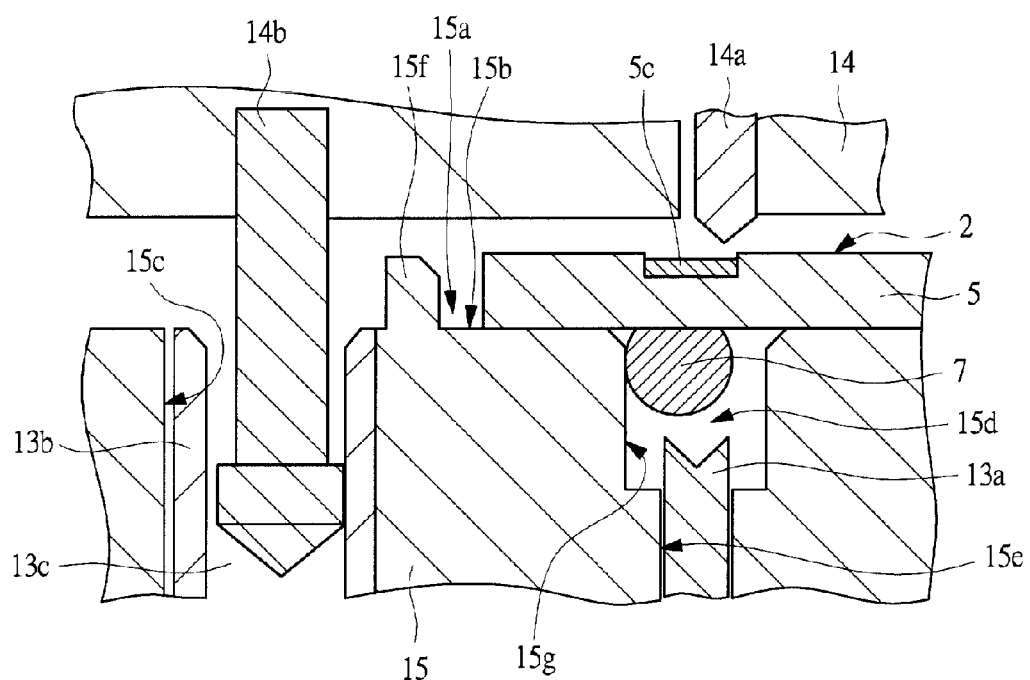
FIG. 9 is an enlarged partial cross-sectional view showing a structure of a major portion of the socket in FIG. 8.
Figure 10:
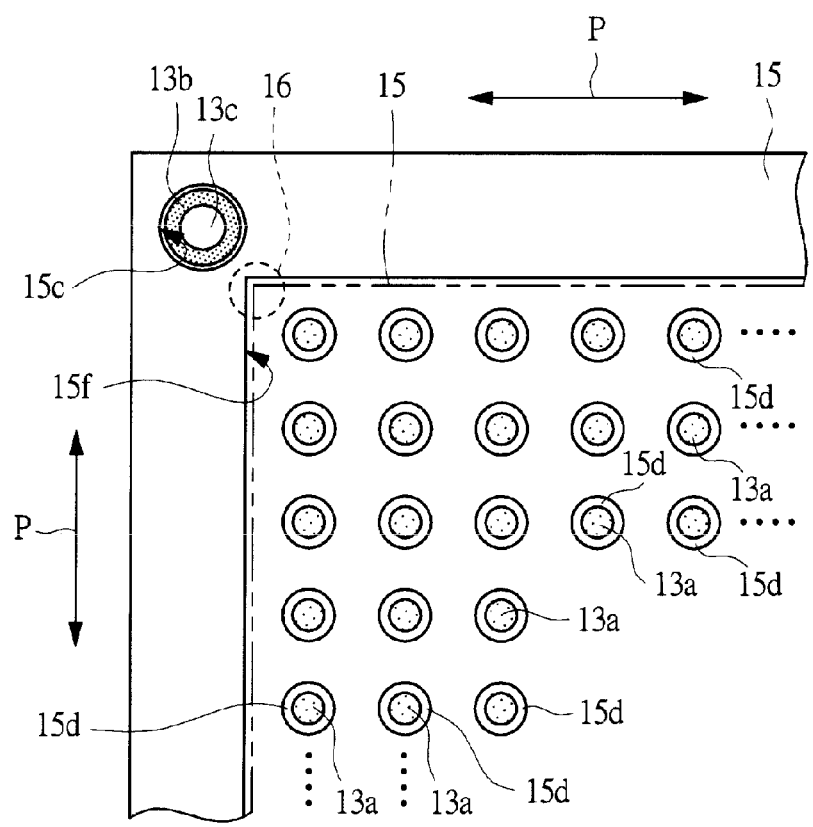
FIG. 10 is an enlarged partial plan view showing a structure of a movable pedestal of the socket in FIG. 8.
Figure 11:
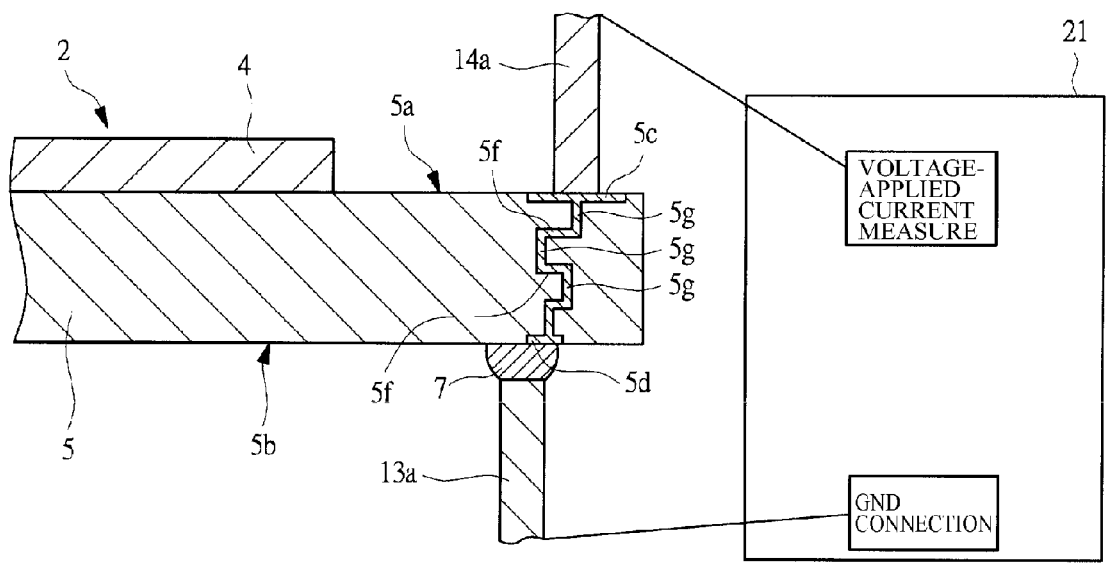
FIG. 11 is an equivalent circuit diagram showing an equivalent circuit during a conduction test using the socket in FIG. 8.
Figure 12:
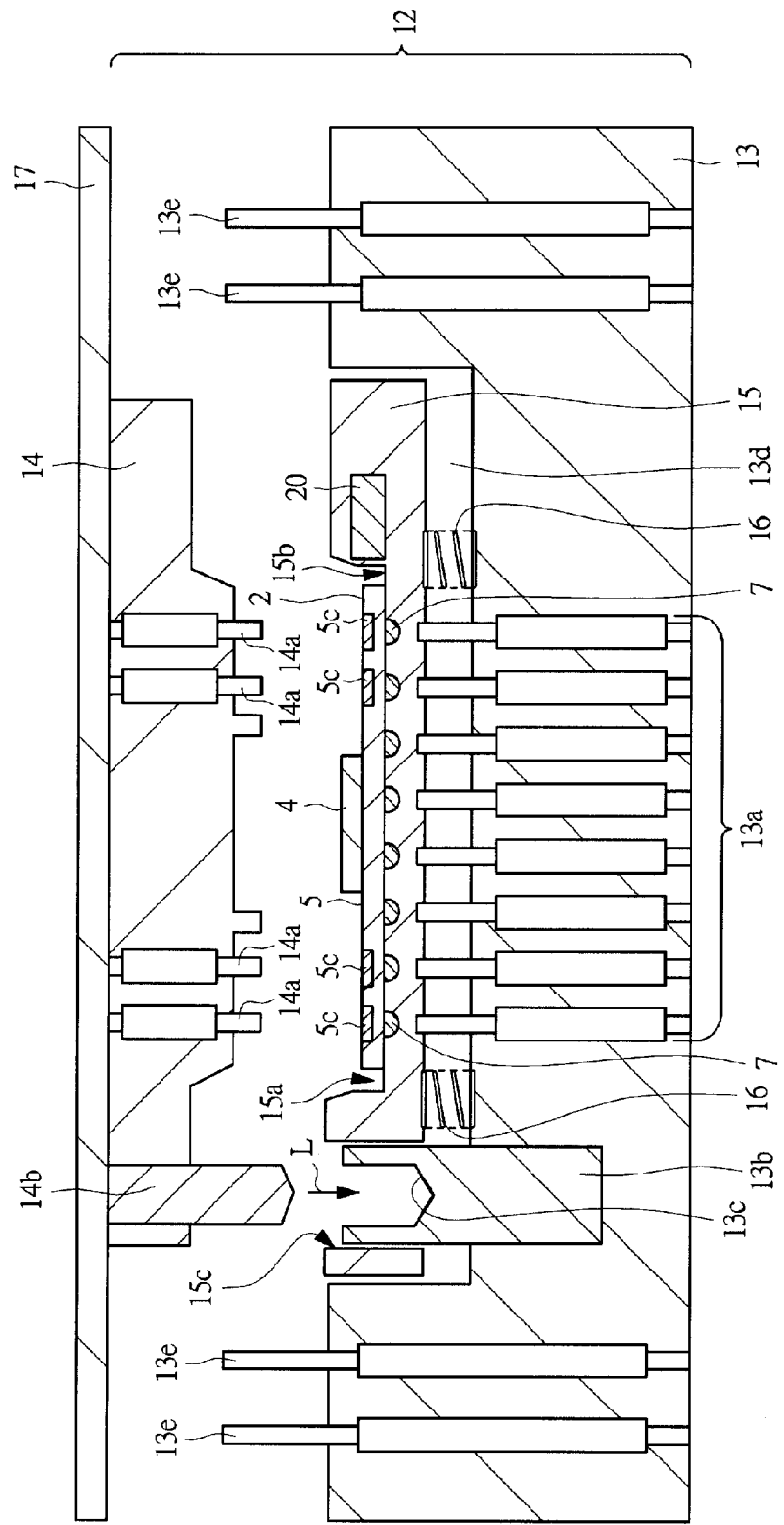
FIG. 12 is a cross-sectional view showing an operation during the test in the socket in FIG. 8.
Figure 13:
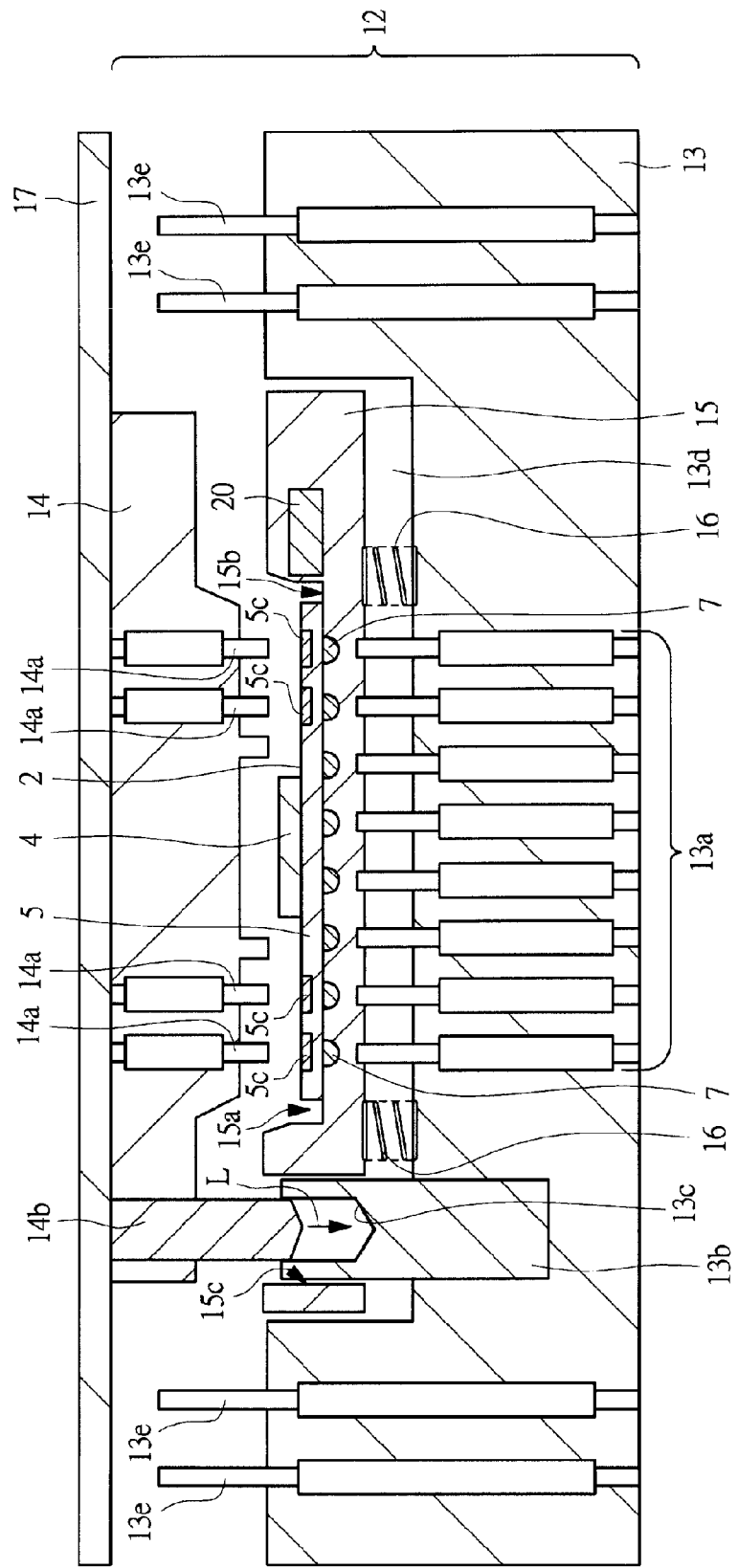
FIG. 13 is a cross-sectional view showing an operation during the test in the socket in FIG. 8.
Figure 14:
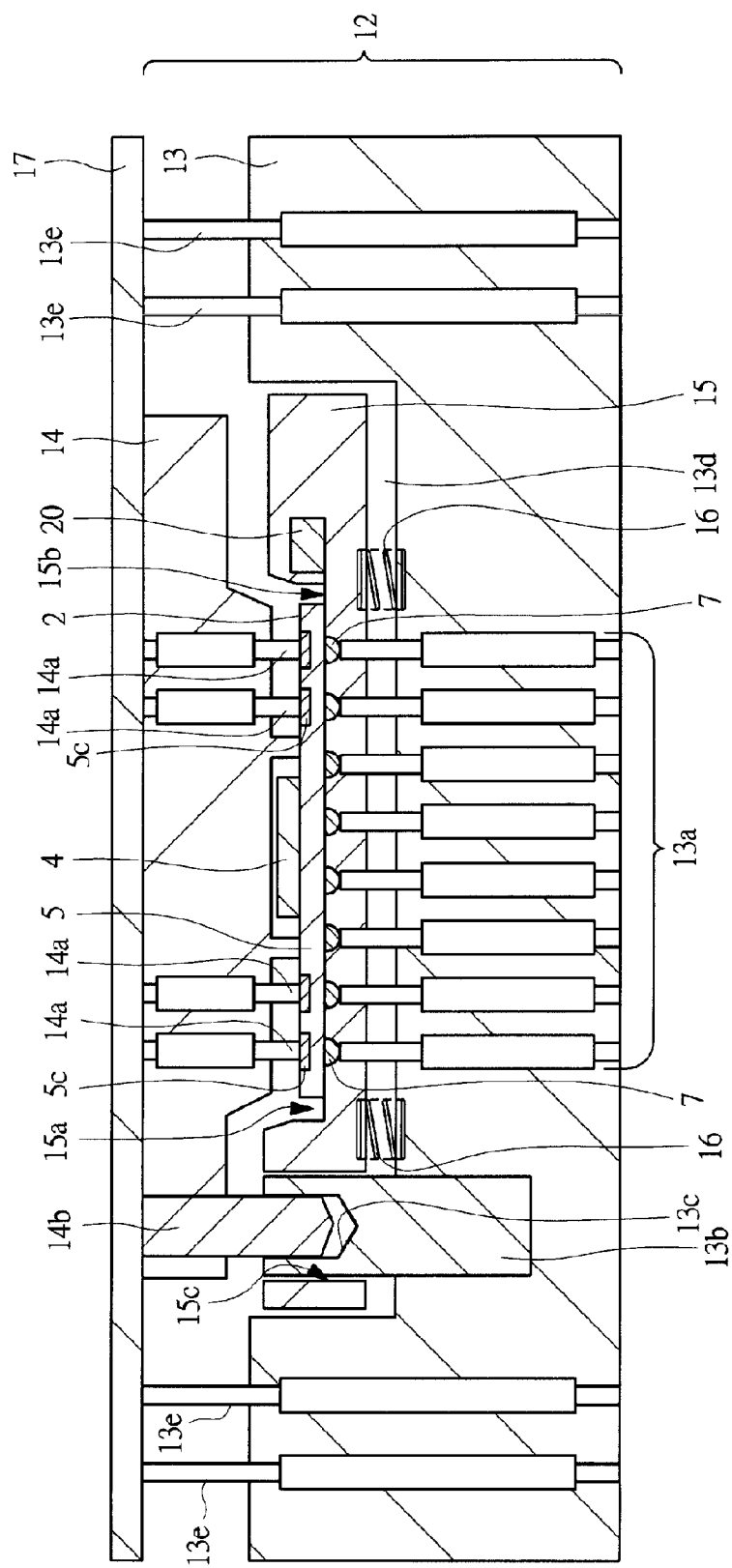
FIG. 14 is a cross-sectional view showing an operation during the test in the socket in FIG. 8.
Figures 15, 16:
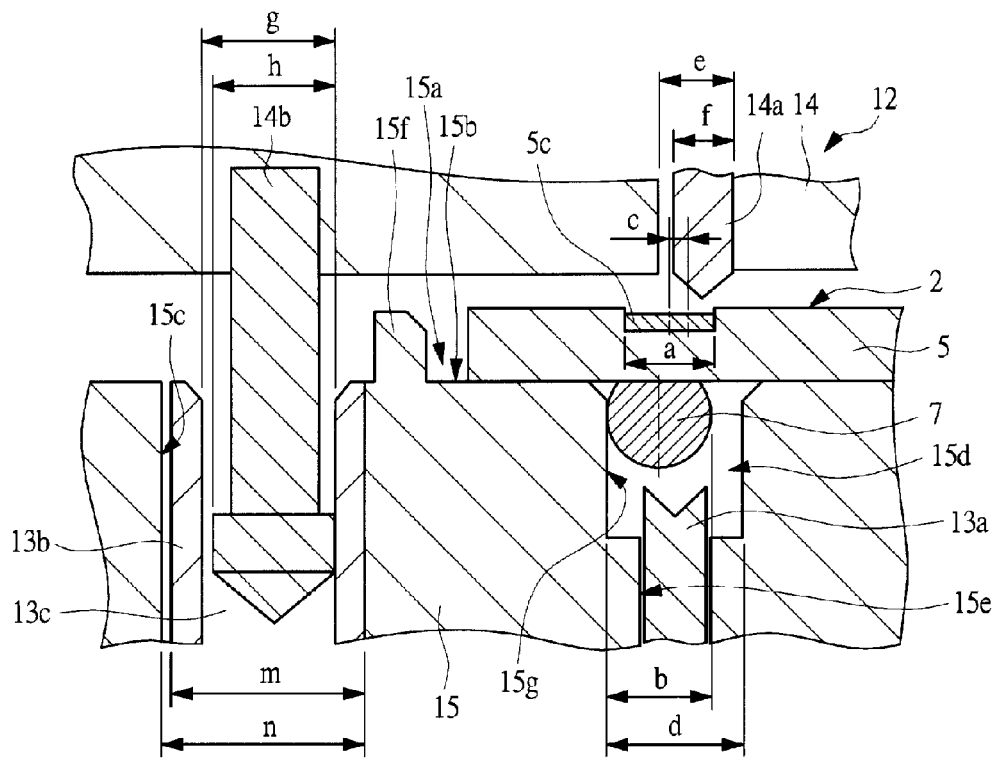
FIG. 15 is an enlarged partial cross-sectional view showing the structure of the major portion of the socket in FIG. 8.
FIG. 16 is a data diagram showing values used in simulation of the contact position of a contact pin in the major portion of the socket of FIG. 8.
Figure 17:
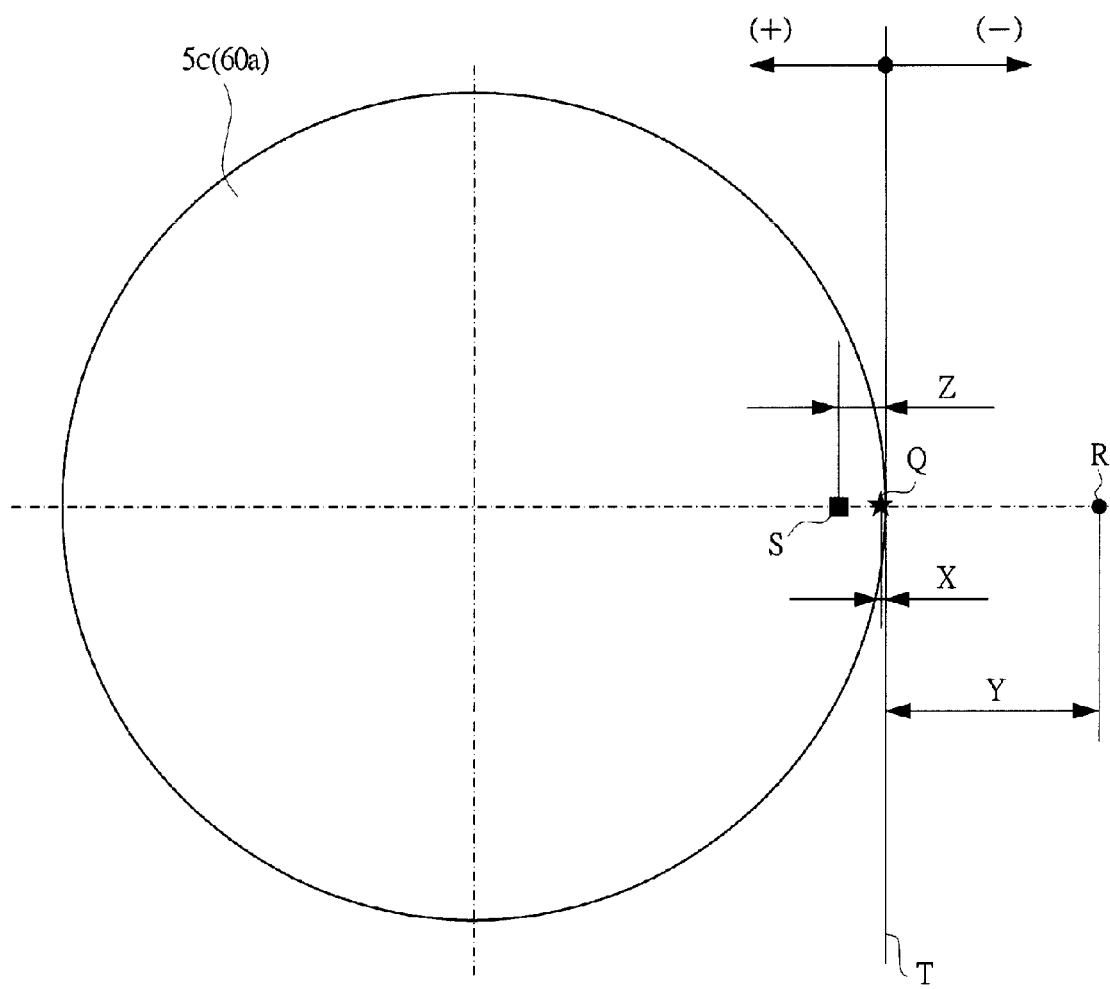
FIG. 17 is a plan view showing a result of the simulation in FIG. 16.
Figure 18:
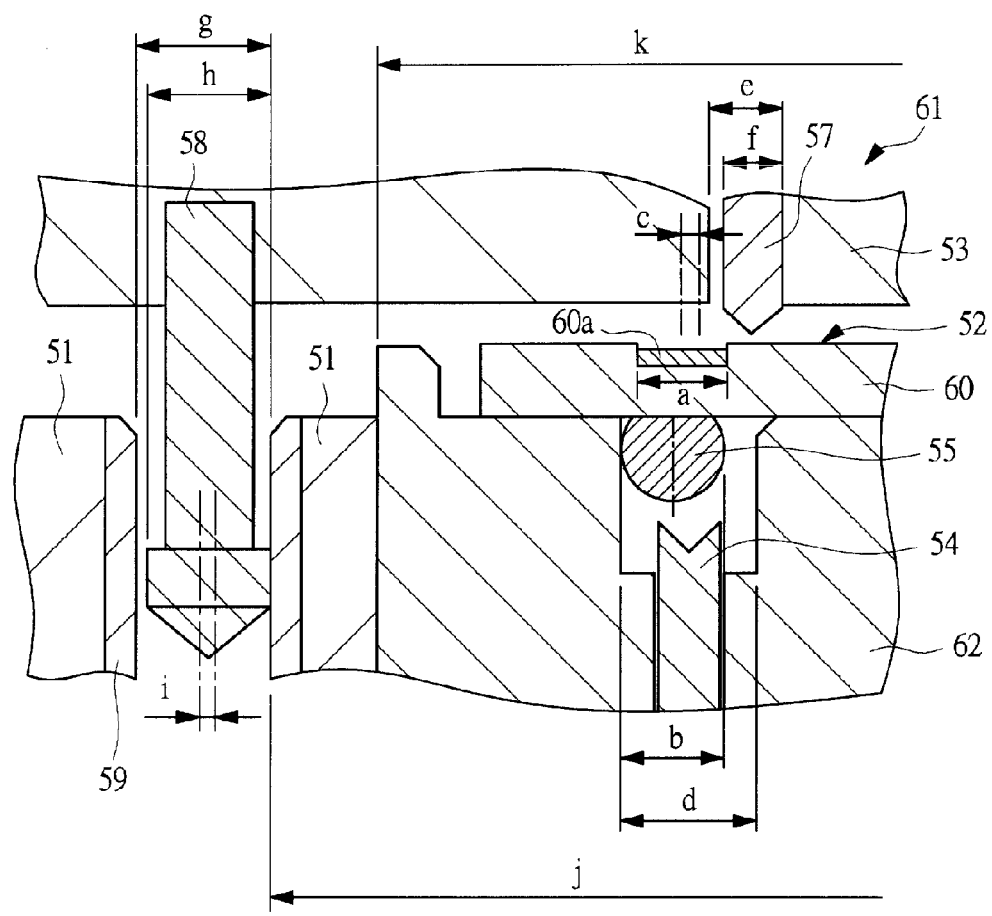
FIG. 18 is an enlarged partial cross-sectional view showing the structure of a major portion of a socket of a comparative example.

FIG. 8 is a cross-sectional view showing a structure of a socket used in the test step in FIG. 7, FIG. 9 is an enlarged partial cross-sectional view showing a structure of a major portion of the socket of FIG. 8. FIG. 10 is an enlarged partial plan view showing a structure of a movable pedestal of the socket of FIG. 8. FIG. 11 is an equivalent circuit diagram showing an equivalent circuit during the conduction test using the socket in FIG. 8. Moreover, FIGS. 12 to 14 are cross-sectional views showing an operation during the test in the socket in FIG. 8. FIG. 15 is an enlarged partial cross-sectional view showing the structure of the major portion of the socket in FIG. 8. FIG. 16 is a data diagram showing the values used in a simulation of the contact position of a contact pin in the major portion of the socket in FIG. 8. FIG. 17 is a plan view showing a result of the simulation in FIG. 16. Furthermore, FIG. 18 is an enlarged partial cross-sectional view showing the structure of a major portion of a socket of a comparative example. FIG. 19 is a data diagram showing the values used in a simulation of the contact position of a contact pin in the major portion of the socket in FIG. 18. FIG. 20 is an external view showing an assembly of the POP in FIG. 1.

In the substrate conduction test of Step S7, as shown in FIG. 11, whether or not there is a disconnection in the internal wiring 5f or the via 5g between the pre-stack land 5c of the wiring substrate 5 of the lower package 2 and the external-terminal land 5d is tested. At this time, a wiring resistance between the pre-stack land 5c and the external-terminal lands 5d is measured to test whether or not there is a disconnection in the internal wiring 5f or the via 5g.

Next, the structure of the socket 12 of FIG. 8 used in the substrate conduction test of Step S7 will be described.

The socket 12 of the embodiment includes a movable pedestal 15 capable of placing the lower package 2 on, a base section 13 arranged under the movable pedestal 15, and a lid section 14 which is arranged above the lower package 2 during the conduction test.

The lid section 14 includes a plurality of first contact pins 14a capable of contacting the pre-stack lands 5c on the upper surface 5a of the wiring substrate 5. Furthermore, a positioning pin 14b for positioning between the lid section 14 and the base sections 13 is embedded into the lid section 14. The first contact pins 14a are arranged such that the tip of each pin faces the upper surface 5a of the wiring substrate 5 which is an item to be tested. The first contact pins 14a are provided such that the extending directions are along a direction intersecting with the upper surface 5a of the wiring substrate 5, and are provided in an arrangement similar to the arrangement of the pre-stack lands 5c on the upper surface 5a of the wiring substrate 5 in FIG. 4, with one-to-one correspondence with the pre-stack lands 5c.

The positioning pin 14b is also provided to extend in the same direction as that of the first contact pin 14a.

In contrast, the base section 13 includes a plurality of second contact pins 13a capable of contacting the solder balls 7 which are the external terminals. Furthermore, a positioning pin 13b which is a positioning member engaging with the positioning pin 14b is embedded into the base section 13. The second contact pins 13a are arranged such that the tip of each pin faces the lower surface 5b of the wiring substrate 5 which is the item to be tested. The second contact pins 13a are provided such that the extending directions are along a direction intersecting with the lower surface 5b of the wiring substrate 5, and are also provided in an arrangement similar to the arrangement of the solder balls 7 on the lower surface 5b of the wiring substrate 5 in FIG. 5, with one-to-one correspondence with the solder balls 7.

The positioning pin 13b is also arranged to extend in the same direction as that of the second contact pin 13a.

Moreover, in the base section 13, a concave portion 13d is formed near the center of the wiring substrate 5 where the first contact pins 14a and the second contact pins 13a are arranged, and the positioning pin 13b is embedded to project into the concave portion 13d. Furthermore, in the base section 13, a plurality of third contact pins 13e arranged penetrating the base section 13 around the concave portion 13d is provided, and the third contact pins 13e are arranged to extend in the same direction as that of the second contact pins 13a.

As described above, the positioning pin 13b embedded into the base section 13 and the positioning pin 14b embedded into the lid section 14 are embedded such that the positioning pin 13b and the positioning pin 14b are also arranged to face each other when the base section 13 and the lid section 14 are arranged to face each other during the substrate conduction test.

The positioning pin 13b embedded into the base section 13 is cylindrical and has a pore 13c formed in along the extending direction of the positioning pin 13b.

Accordingly, during the substrate conduction test, the base section 13 and the lid section 14 are positioned by inserting the positioning pin 14b of the lid section 14 into the pore 13c of the positioning pin 13b of the base section 13. Furthermore, the pore 13c is formed to have a size in which the pore diameter has a fitting (clearance-fitting) relationship with the positioning pin 14b, and the relationship is such that the positioning pin 14b can slide in the vertical direction (in the extending direction of each pin) in a state in which the positioning pin 14b is being positioned relative to the positioning pin 13b with high accuracy.

By inserting the positioning pin 14b of the lid section 14 into the pore 13c of the positioning pin 13b of the base section 13 from the above, the base section 13 and the lid section 14 can be positioned and the lid section 14 can slide in the vertical direction (in the extending direction of each pin) by being guided by the pore 13c of the positioning pin 13b.

Moreover, the movable pedestal 15 is provided in the socket 12 in accordance with the embodiment. The movable pedestal 15 is arranged in the concave portion 13d of the base section 13, and fits into the positioning pin 13b which is the positioning member. The movable pedestal 15 is provided movably along the extending direction of the second contact pin 13a under the guidance of the positioning pin 13b.

More specifically, the movable pedestal 15 includes a concave substrate-mounting portion 15a near the center in the plane direction. In the substrate mounting portion 15a, a substrate placement surface 15b serving as a receiving surface of the wiring substrate 5 of the lower package 2 is formed. The substrate conduction test is performed in a state in which the wiring substrate 5 is being supported by the substrate placement surface 15b.

Moreover, on the outer side of the substrate mounting portion 15a, a through-hole 15c allowing the positioning pin 13b to penetrate therethrough is formed. The positioning pin 13b penetrates the through-hole 15c, so the movable pedestal 15 is positioned by the positioning pin 13b. The through-hole 15c is formed to have a size in which the pore diameter has a fitting (clearance-fitting) relationship with the positioning pin 13b, and the relationship is such that the through-hole 15c can slide in the vertical direction (in the extending direction of each pin) in a state in which the movable pedestal 15 is being positioned relative to the positioning pin 13b with high accuracy.

The positioning pin 13b penetrates the through-hole 15c of the movable pedestal 15. Then, the positioning pin 13b and the movable pedestal 15 are positioned, and the base section 13 into which the positioning pin 13b is embedded and the movable pedestal 15 are also positioned. Furthermore, the movable pedestal 15 can slide in the vertical direction (in the extending direction of each pin) by being guided by the positioning pin 13b.

The movable pedestal 15 is square in plan, and the positioning pin 13b is arranged at a corner portion on one diagonal line of two diagonal lines (see FIG. 10). Accordingly, the movable pedestal 15 is positioned by two positioning pins 13b. However, the number of positioning pins 13b is not limited to two.

Moreover, the back side of the movable pedestal 15 is supported by a spring (elastic member) 16. A plurality of springs 16 is provided between the concave portion 13d of the base section 13 and the movable pedestal 15 (at four places each corresponding to a place near the corner part of the wiring substrate 5).

The movable pedestal 15 is attached to the base section 13 via the spring 16. So, the movable pedestal 15, when pressurized by the first contact pin 14a from the above, is held to push back upward by the elastic force of the spring 16.

Furthermore, as shown in FIG. 9, on the substrate placement surface 15b of the substrate mounting portion 15a of the movable pedestal 15, there is formed a plurality of pocket portions (concave portions) 15d which is a plurality of pores one-to-one corresponding to the solder balls 7 which are the external terminals of the lower package 2. The pocket portions 15d are formed one-to-one corresponding to the solder balls 7 and thus, as shown in FIG. 10, are formed in the same arrangement as the arrangement of the solder balls 7 of the lower package 2 of FIG. 5.

Moreover, as shown in FIG. 9, in the movable pedestal 15, through-holes 15e opened in the pocket portions 15d are formed, in which a second contact pin 13a is arranged in each through-hole 15e. The second contact pin 13a arranged in each through-hole 15e, before the wiring substrate 5 is pressurized by the first contact pin 14a from the above and the movable pedestal 15 sinks, has a length to the extent that it slightly projects into each pocket portion 15d.

Then, the depth of each pocket portion 15d is formed sufficiently deeper than the diameter of the solder ball 7. Therefore, when the wiring substrate 5 of the lower package 2 is supported by the substrate placement surface 15b (when the wiring substrate 5 is not pressurized by the first contact pin 14a from the above), each pocket portion 15d is formed deep enough for the solder ball 7 not to bump against the second contact pin 13a.

As shown in FIG. 9, the positioning of the lower package 2 in placing the lower package 2 in the substrate mounting portion 15a of the movable pedestal 15 is made by each solder ball 7 of the lower package 2 being placed in each corresponding pocket portion 15d. At this time, a clearance between the periphery of the wiring substrate 5 and a wall 15f of the substrate mounting portion 15a is larger than a clearance between the solder ball 7 and an inner wall 15g of the pocket portion 15d. The clearance between the periphery of the wiring substrate 5 and the wall 15f of the substrate mounting portion 15a is determined by a stopping accuracy and the like when a non-illustrated handler mounts the lower package 2 onto the movable pedestal 15. Furthermore, because this clearance is set such that the periphery of the wiring substrate 5 does not bump against the wall 15f of the substrate mounting portion 15a, the clearance between the solder ball 7 and the inner wall 15g of the pocket portion 15d must be set smaller than the clearance between the periphery of the wiring substrate 5 and the wall 15f of the substrate mounting portion 15a.

In the substrate conduction test, first, the lower package 2 is placed on the substrate mounting portion 15a by placing the solder ball 7 in the pocket portion 15d of the substrate mounting portion 15a of the movable pedestal 15 of the socket 12. Subsequently, by lowering the lid section 14 to bring the first contact pin 14a into contact with the pre-stack land 5c on the upper surface 5a of the wiring substrate 5, the wiring substrate 5 is pressed. Due to the downward pressing action by the first contact pin 14a, the movable pedestal 15 sinks, and when the solder ball 7 contacts the second contact pin 13a projecting into the pocket portion 15d, the lowering of the lid section 14 is stopped. At this time, the movable pedestal 15 is pressed from below upward by the spring 16 and thus as shown in FIG. 8, on the upper surface side of the wiring substrate 5, the first contact pin 14a can contact the pre-stack land 5c, while on the lower surface side, the second contact pin 13a can contact the solder ball 7. In this state, the substrate conduction test is performed.

In the socket 12 of the embodiment, as shown in FIG. 10, the movable pedestal 15 is positioned relative to an arrangement direction P of the second contact pins 13a by the positioning pin 13b. In this state, as shown in FIG. 8, on the upper surface side of the wiring substrate 5 of the lower package 2, the first contact pin 14a is brought into contact with the pre-stack land 5c of the wiring substrate 5, while on the lower surface side of the wiring substrate 5, the second contact pin 13a is caused to penetrate the base section 13 and is brought into contact with the solder ball 7 of the lower package 2, and the substrate conduction test is performed.

In the substrate conduction test, as shown in FIG. 11, whether or not there is a disconnection in the internal wiring 5f or the via 5g between the pre-stack land 5c of the wiring substrate 5 of the lower package 2 and the external-terminal land 5d (solder ball 7) is tested.

Moreover, during the substrate conduction test, as shown in FIG. 8, a conversion substrate 17 is arranged over the lid section 14 of the socket 12 while under the base section 13, a test board 18 is arranged. At this time, the first contact pins 14a are electrically connected to the conversion substrate 17, and the second contact pins 13a are electrically connected to the test board 18, and furthermore the third contact pins 13e are electrically connected to both the conversion substrate 17 and the test board 18.

Thus, a flow of an electric signal 19 as shown in FIG. 8 is formed, and the substrate conduction test is performed via the test board 18 by a tester 21 in FIG. 11.

Next, the details of the movement of the socket 12 during the substrate conduction test of the embodiment will be described.

First, the lower package (semiconductor device) 2 is prepared, the lower package including the wiring substrate 5 and the semiconductor chip 4, in which in the wiring substrate 5, the pre-stack lands 5c are formed on the upper surface 5a as shown in FIG. 2 and the external-terminal lands 5d are formed on the lower surface 5b, and furthermore the pre-stack land 5c and the external-terminal land 5d are electrically connected to each other by the internal wiring 5f and via 5g in FIG. 11 or the like, in which the semiconductor chip 4 is mounted onto the upper surface of the wiring substrate 5, and in which the solder balls 7 which are the external terminals are connected to the external-terminal land 5d. The lower package 2 assembled by performing the cutting in Step S6 in FIG. 6 is prepared.

Subsequently, the lower package 2 is held and transported by a non-illustrated handler, and as shown in FIG. 12, the lower package 2 is mounted onto (inserted into) the substrate mounting portion 15a of the movable pedestal 15 of the base section 13 of the socket 12.

In this case, as shown in FIG. 9 the lower package 2 is positioned by placing each solder ball 7 in the pocket portion 15d provided in the substrate mounting portion 15a of the movable pedestal 15. Therefore, the lower package 2 is supported by the substrate placement surface 15b of the substrate mounting portion 15a of the movable pedestal 15. In the socket 12 of the embodiment, the positioning pin 13b is fitted into each of two through-holes 15c provided in the movable pedestal 15, and thus the movable pedestal 15 is positioned relative to the arrangement direction of the second contact pin 13a. Furthermore, also each solder ball 7 of the lower package 2 has been placed in each pocket portion 15d of the movable pedestal 15, and thus the lower package 2 is positioned relative to the arrangement direction P of the second contact pin 13a in FIG. 10.

Subsequently, as shown in FIG. 12, the lid section 14 is arranged above the movable pedestal 15 of the base section 13, and the position of the pore 13c of the positioning pin 13b is aligned with the position of the positioning pin 14b. Then, by lowering the lid section 14 (L-shaped portion) to insert the positioning pin 14b into the pore 13c of the positioning pin 13b from the above, as shown in FIG. 13, the positioning pin 13b and the positioning pin 14b are fitted together.

Thus, the base section 13 and the lid section 14 are positioned. The first contact pins 14a of the lid section 14 are positioned in the arrangement direction P in FIG. 10 such that it can contact the pre-stack lands 5c of the wiring substrate 5. In contrast, the second contact pins 13a of the base section 13 are also positioned in the arrangement direction P such that it can contact the solder balls 7 of the wiring substrate 5.

Subsequently, by further lowering the lid section 14, the first contact pin 14a is brought into contact with the pre-stack land 5c of the wiring substrate 5 and also the second contact pin 13a is brought into contact with the solder ball 7 on the lower surface 5b side of the wiring substrate 5.

At this time, the movable pedestal 15 is supported by the springs 16 between the movable pedestal 15 and the base sections 13 under the movable pedestal 15 and is provided slidably with respect to the positioning pin 13b, and thus when the wiring substrate 5 is pressed from the above by the contact of the first contact pin 14a with the pre-stack land 5c, the movable pedestal 15 sinks downward. When the solder ball 7 contacts the second contact pin 13a projecting into the pocket portion 15d because the movable pedestal 15 has sunk, the lowering of the lid section 14 is stopped.

The movable pedestal 15 is pressed from below upward by the spring 16, and thus, as shown in FIG. 14, on the upper surface side of the wiring substrate 5, the first contact pin 14a contacts a pre-stack land 5c, while on the lower surface side, the second contact pin 13a contacts the solder ball 7.

As described above, the substrate conduction test is performed in a state in which the first contact pin 14a is brought into contact with the pre-stack land 5c on the upper surface 5a of the wiring substrate 5 and also in which the second contact pin 13a is brought into contact with the solder ball 7 of the lower surface 5b. The conduction test of the wiring substrate 5 is performed via the first contact pin 14a and the second contact pin 13a.

During the substrate conduction test, as shown in FIG. 8, the conversion substrate 17 is arranged over the lid section 14 of the socket 12, while under the base section 13 the test board 18 is arranged. At this time, the first contact pins 14a are electrically connected to the conversion substrate 17, also the second contact pins 13a are electrically connected to the test board 18, and furthermore the third contact pins 13e are electrically connected to both the conversion substrate 17 and the test board 18.

Therefore, the flow of the electric signal 19 as shown in FIG. 8 is formed, and the substrate conduction test is performed via the test board 18 by the tester 21 in FIG. 11.

In the substrate conduction test, as shown in FIG. 11, whether or not there is a disconnection in the internal wiring 5f or the via 5g between the pre-stack land 5c of the wiring substrate 5 and the external-terminal land 5d is tested. In this case, by measuring a wiring resistance between the pre-stack land 5c and the external-terminal land 5d (between the pre-stack land 5c and the semiconductor chip 4), whether or not there is a disconnection in the internal wiring 5f or the via 5g is tested. Moreover, the measurement of the wiring resistance is preferably performed on all pins (on all the solder balls 7).

Figure 25:
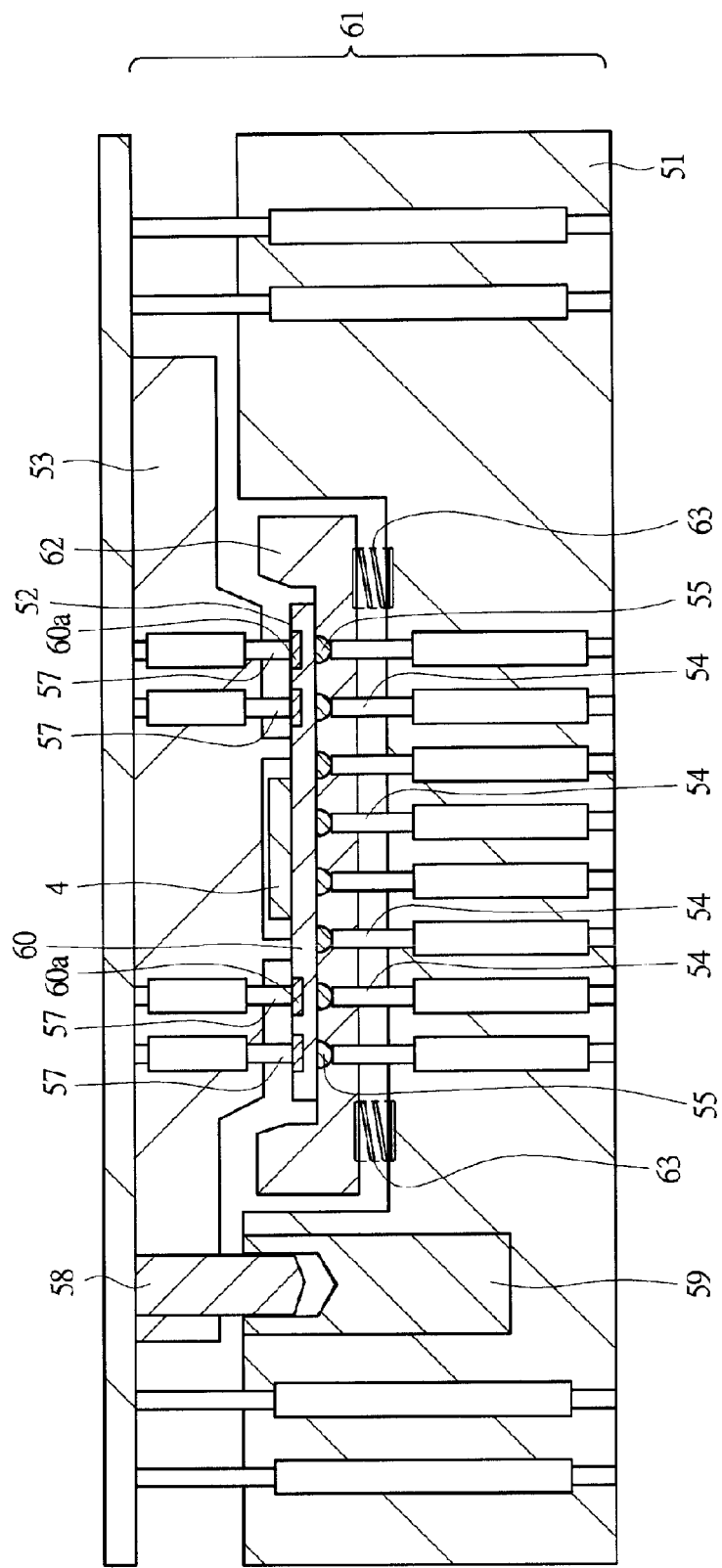
FIG. 25 is a cross-sectional view showing the structure of a major portion of a socket of a second comparative example.

Next, a simulation result of the contact position of a contact pin during the substrate conduction test in using the socket 12 of the embodiment and that of the contact position of a contact pin during the substrate conduction test in using a socket 61 of a second comparative example in FIG. 25 will be described.

First, by using FIGS. 15 to 17, a case using the socket 12 in accordance with the embodiment will be described.

Through the use of the major portion of the socket 12 in accordance with the embodiment in FIG. 15 and the values used in simulation in FIG. 16 corresponding to each section of FIG. 15, as shown in FIG. 17, which part of the pre-stack land 5c the first contact pin 14a contacts with reference to a land edge T of the pre-stack land 5c has been simulated and its result will be described.

In the simulation, the results depends on whether the first contact pin 14a is on the plus (+) side of the land edge T or on the minus (−) side in FIG. 17, and when the first contact pin 14a is on the plus (+) side, the result indicates that the first contact pin 14a contacts the pre-stack land 5c, while when the first contact pin 14a is on the minus (−) side, the result indicates that the first contact pin 14a does not contact the pre-stack land 5c. Moreover, for each value used in simulation in FIG. 16, a value in the worst case of the design tolerances is used.

First, in the calculation formula of the simulation in the socket 12 in accordance with the embodiment, a distance X from the land edge T at a contact position Q is expressed by $X=a/2-((d-b)+c+(e-f)+(m-n)+(g-h))/2$. When the values used in simulation of each section in FIG. 16 are substituted into this calculation formula and calculated, the distance X at the contact position Q is X=0.002, which corresponds to the position of the point Q in FIG. 17. The first contact pin 14a contacts a place located inward (to the plus (+) side) by a distance of 0.002 from the land edge T of the pre-stack land 5c, resulting in the fact that the first contact pin 14a and the pre-stack land 5c contact each other.

Next, by using FIGS. 17 to 19, the case using the socket 61 of the second comparative example will be described.

Through the use of the major portion of the socket 61 of the second comparative example in FIG. 18 and the values used in simulation in FIG. 19 corresponding to each section of FIG. 18, as shown in FIG. 17, which part of the pre-stack land 60a the contact pin 57 contacts with reference to the land edge T of the pre-stack land 60a has been simulated, and its result will be described.

Also in FIG. 19, for each value used in simulation, value in the worst case of the design tolerances is used.

For the calculation formula of the simulation in the socket 61 of the second comparative example, a distance Y from the land edge T of the contact position R is expressed by $Y=a/2-((d-b)+c+(e-f)+(j-k)+i+(g-h))/2$. When the values used in simulation of each section in FIG. 19 are substituted into this calculation formula and calculated, the distance Y at the contact position R is X=−0.083, which corresponds to the position of the point R in FIG. 17. The contact pin 57 contacts a place being deviated by a distance of 0.083 outward (to the minus (−) side) from the land edge T of the pre-stack land 60a, resulting in the fact that the contact pin 57 and the pre-stack land 60a do not contact each other.

According to the above simulation results, through the use of the socket 12 in accordance with the embodiment, the first contact pin 14a no more contacts at a position deviating from the pre-stack land 5c during the substrate conduction test, resulting in the fact that the first contact pin 14a and the pre-stack land 5c contact each other.

Subsequently, the product characteristic test in Step S8 in FIG. 7 is performed only on the lower package 2 which has been determined to be non-defective through the substrate conduction test using the socket 12 in accordance with the embodiment.

In the test step, first, the conduction test of the wiring substrate 5 is performed, and the product characteristic test (inspection) is performed on the non-defective lower package 2 which has been selected through this conduction test. The product characteristic test include a DC test, an analog test, an AC test, and a function test.

Subsequently, the lower package 2 which has passed in the product characteristic test is shipped as a product, and at a destination of delivery, as shown in FIG. 20, the POP1 shown in FIG. 1 is assembled by connecting the lower package 2 to the upper package 3. Alternatively, the POP1 in FIG. 1 may be assembled by connecting the lower package 2, which has passed in the product characteristic test, to the upper package 3, and then this POP1 may be shipped.

According to the manufacturing method of the semiconductor device (lower package 2) in accordance with the embodiment, in a state in which the movable pedestal 15 is being positioned relative to the arrangement direction P of the second contact pin 13a by the positioning pin 13b provided in the base section 13 of the socket 12, the substrate conduction test is performed by bringing the first contact pin 14a into contact with the pre-stack land 5c and also by bringing the second contact pin 13a into contact with the solder ball 7, and then an electric inspection (substrate conduction test) can be performed by precisely positioning the first contact pin 14a side and the second contact pin 13a side.

The positioning pin 13b attached to the base section 13 of the socket 12, and the movable pedestal 15 are fitted together and the positioning pin 14b attached to the lid section 14 of the socket 12 and the positioning pin 13b of the base section 13 engage with each other (fit together), and thus the movable pedestal 15 is positioned relative to the arrangement direction P of the second contact pin 13a. Therefore, there is no need to consider a positional deviation between the movable pedestal 15 and the base section 13, the position of the positioning pin 13b relative to the lower package 2, and the like. Additionally, the positioning accuracy between the lower package 2 and the first contact pin 14a as well as the second contact pin 13a can be increased. Furthermore, in this state, the conduction test which is the electric inspection of the lower package 2 can be performed.

Thus, the electric inspection can be normally performed and the reliability of the electric inspection can be improved.

Moreover, the substrate conduction test is performed by accurately positioning the first contact pin 14a side and the second contact pin 13a side, and thus the possibility that the first contact pin 14a and the second contact pin 13a contact the solder resist of the wiring substrate 5 can be reduced and the possibility that the wiring substrate 5 is damaged can be reduced.

As a result, the quality of the lower package 2 or the POP1 can be improved.

Furthermore, because the quality of the lower package 2 or the POP1 can be improved, the yield of the lower package 2 or the POP1 can be improved.

Moreover, in the assembly of the lower package 2 of the POP1, as described above, due to the thermal history in the flip-chip bonding step or in the solder ball mounting step, a part of the internal wiring 5f or via 5g of the wiring substrate 5 may become highly resistive (partially disconnected) or may be disconnected. In such an assembly of the lower package 2, a defective product can be identified and removed by performing the conduction test of the wiring substrate 5 that is subjected to a thermal history, and the yield of the POP1 can, be improved by combining only the non-defective lower package 2 with the upper package 3. Therefore, the substrate conduction test is of great significance.

Accordingly, by performing the substrate conduction test of the lower package 2 through the use of the socket 12 in accordance with the embodiment, the substrate conduction test can be performed by bringing a contact pin into contact with the pre-stack land 5c on the upper surface 5a side of the wiring substrate 5 and to the solder ball 7 on the lower surface 5b side, and thus the POP1 can be assembled after verifying that the upper surface 5a side and the lower surface 5b side of the wiring substrate 5 are electrically connected to each other. As a result, the use of the socket 12 in accordance with the embodiment is very effective because of being capable of improving the yield of the POP1 and also from the view point of the great significance of the substrate conduction test in the assembly of the POP1.

Next, a variant of the embodiment will be described.

Figure 21:
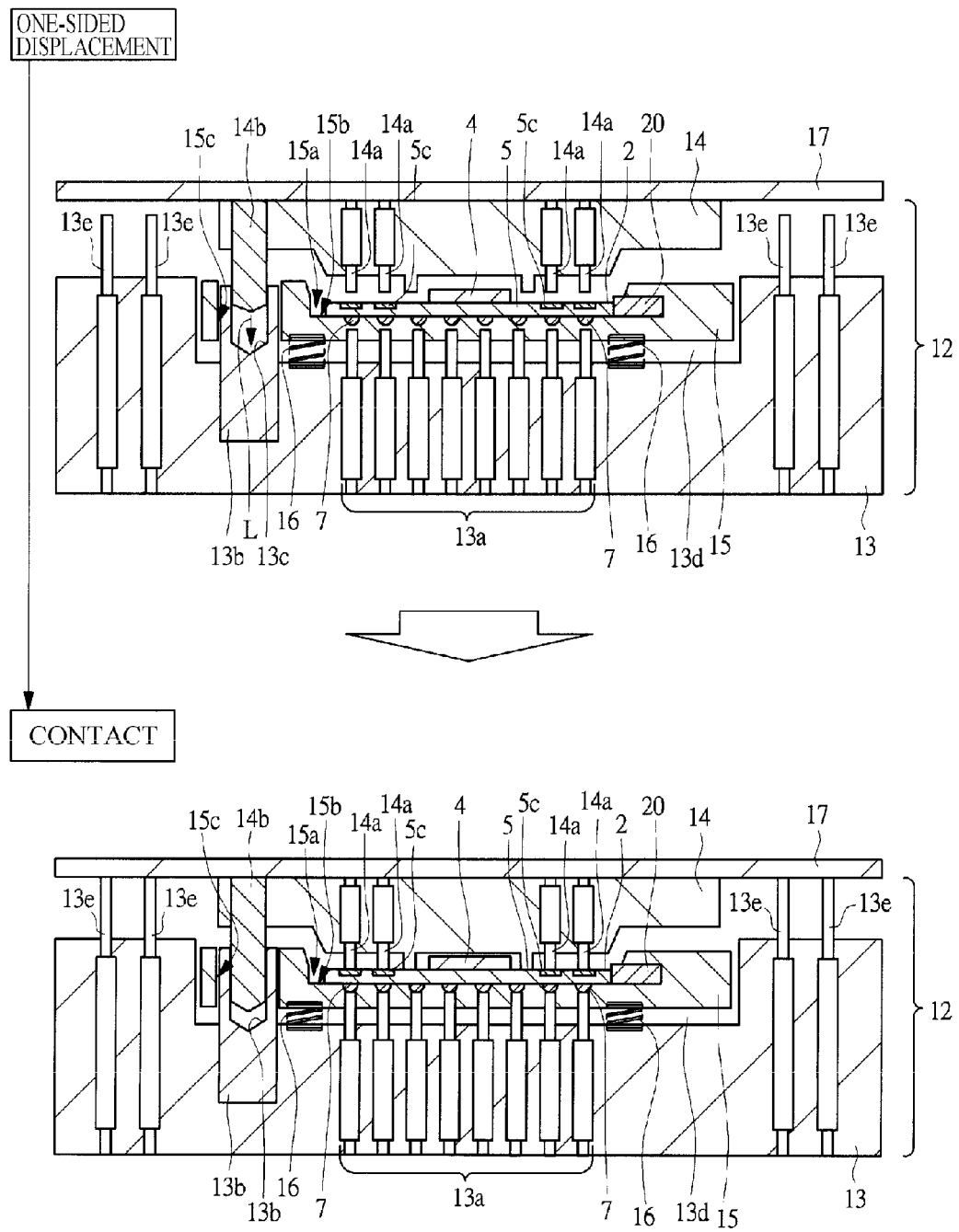
FIG. 21 is a cross-sectional view showing an operation during a test in a socket in accordance with a variant of the embodiment.
Figure 22:
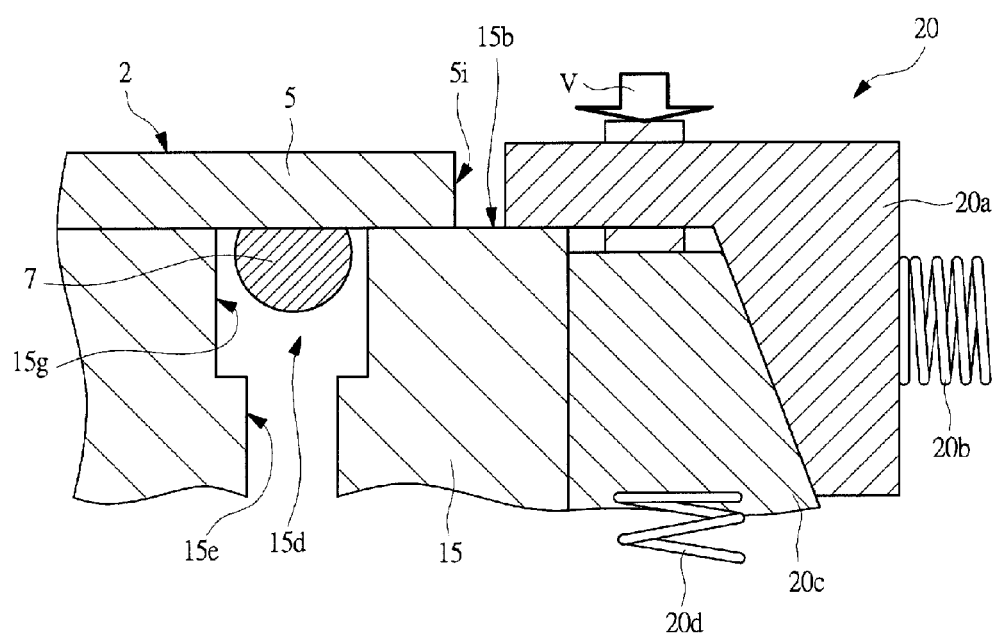
FIG. 22 is an enlarged partial cross-sectional view showing one-sided displacement of the socket in FIG. 21.
Figure 23:
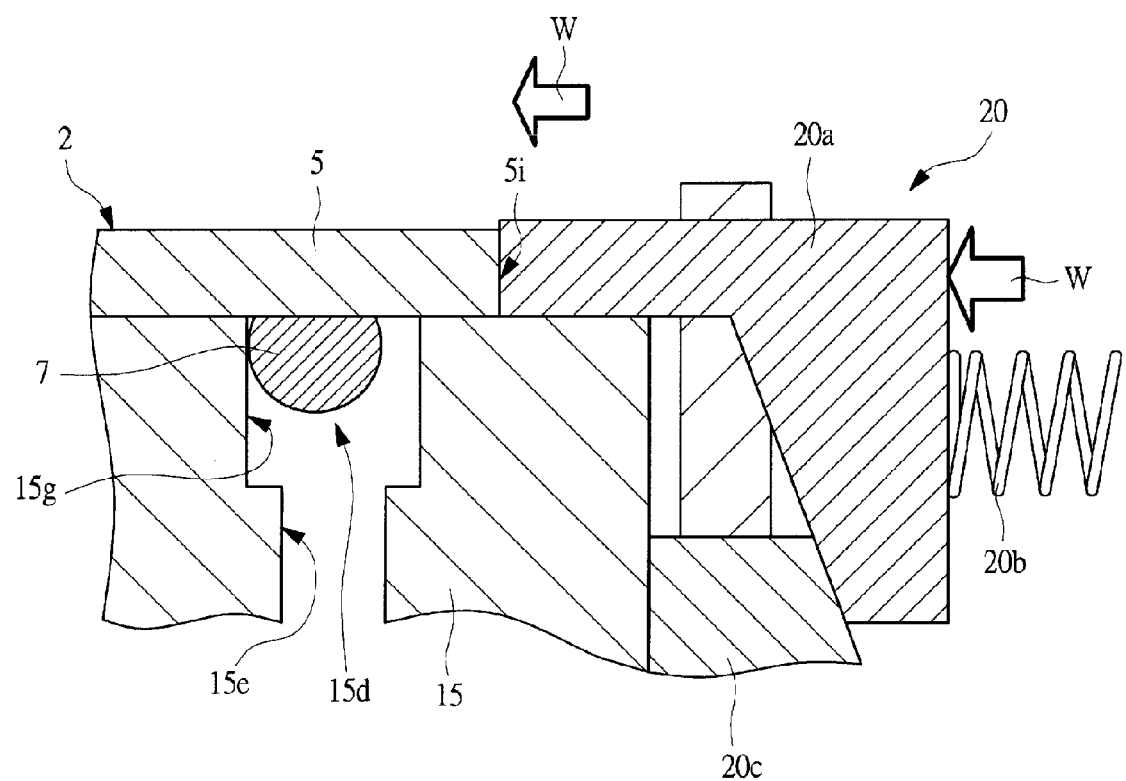
FIG. 23 is an enlarged partial cross-sectional view showing the one-sided displacement of the socket in FIG. 21.
Figure 24:
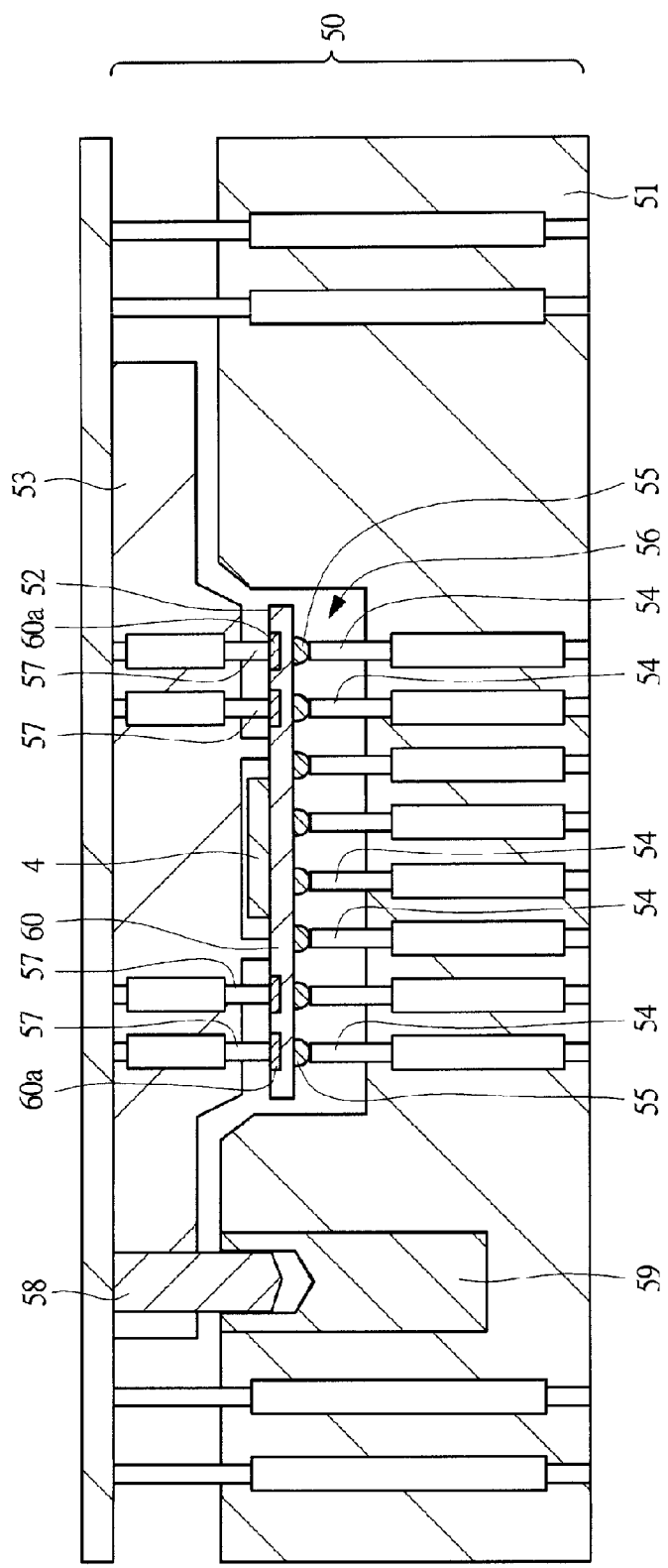
FIG. 24 is a cross-sectional view showing the structure of a major portion of a socket of a first comparative example.

FIG. 21 is a cross-sectional view showing an operation during the test in a socket in accordance with a variant of the embodiment. FIG. 22 is an enlarged partial cross-sectional view showing one-sided displacement of the socket in FIG. 21. FIG. 23 is an enlarged partial cross-sectional view showing the one-sided displacement of the socket in FIG. 21.

FIGS. 21 to 23 show how to operate a one-sided displacement mechanism 20 being provided in the socket 12 in accordance with the embodiment, and how to enhance the accuracy of the positioning of the lower package 2 relative to the movable pedestal 15.

First, the structure and the operation of the one-sided displacement mechanism 20 provided in the socket 12 and the operation will be described. At an edge of the substrate mounting portion 15a of the movable pedestal 15 shown in FIG. 21, the following are provided as shown in FIG. 22: a first block 20a which slides, along the substrate placement surface 15b, and which presses a side surface 5i of the wiring substrate 5 of the lower package 2; a first spring 20b which applies to the first block 20a an elastic force along the substrate placement surface 15b; a second block 20c which is a stopper for limiting a slide movement of the first block 20a in the direction of the wiring substrate; and a second spring 20d which applies an elastic force causing the second block 20c to slide upward.

Accordingly, in displacing the wiring substrate 5 of the lower package 2 to one side, as shown in FIG. 22, a load V is applied, from the above, to the second block 20c that is the stopper and the second block 20c is slid downward, and then the first block 20a is released. Therefore, the first block 20a slides due to the elastic force of the first spring 20b, and presses the side surface 5i of the wiring substrate 5 by the load W as shown in FIG. 23.

Although the wiring substrate 5 whose side surface 5i is pushed slides, either one of the solder balls 7 bumps against the inner wall 15f of the pocket portion 15d and the slide action of the wiring substrate 5 stops, due to this slide movement. Therefore, the wiring substrate 5 is displaced to one side, and in this one-sided state the substrate conduction test is performed.

The substrate conduction test is performed in a state in which the lower package 2 is being displaced to one side relative to the arrangement direction P of the contact pin in FIG. 10 over the movable pedestal 15.

After the completion of the substrate conduction test, by stopping the application of the load V of FIG. 22 to the second block 20c, the second block 20c is released and slides upward by the second spring 20d. The upward slide of the second block 20c causes the first block 20a to return in the direction away from the wiring substrate 5, and thus the pressing of the first block 20a against the wiring substrate 5 also stops. Because of this, the pressing against the wiring substrate 5 is also eliminated, and then the wiring substrate 5 is released.

During the substrate conduction test, as shown in the one-sided displacement in FIG. 21, after mounting the lower package 2 to the movable pedestal 15 and before lowering the lid section 14 (L), the above-mentioned one-sided displacement is first performed and the positioning of the wiring substrate 5 is performed. Then, after the completion of the one-sided displacement, as shown in the contact in FIG. 21, by lowering the lid section 14, the first contact pin 14a is brought into contact with pre-stack land 5c of the wiring substrate 5 and also the second contact pin 13a is brought into contact with the solder ball 7 of the wiring substrate 5. In this state, the substrate conduction test is performed.

By using FIGS. 15 to 17, a simulation of the contact position of the first contact pin 14a in performing one-sided displacement and performing the substrate conduction test will be described.

For the calculation formula of the simulation in performing the one-sided displacement, a distance Z from the land edge T of the contact position S in FIG. 17 is expressed by $Z=a/2-((d-b)/2+c+(e-f)+(m-n)+(g-h))/2$. As with the case where the one-sided displacement is not performed, when the values used in simulation of each section in FIG. 16 is substituted into this calculation formula and calculated, the distance Z of the contact position S is $Z=0.019$, which corresponds to the position of the point S in FIG. 17. The first contact pin 14a contacts a place located inward (to the plus (+) side) by a distance of 0.019 from the land edge T of the pre-stack land 5c, resulting in the fact that the first contact pin 14a and the pre-stack land 5c contact each other at a position located further inward in comparative example with the case where the one-sided displacement is not performed.

In this way, through the use of the one-sided displacement mechanism 20, by performing the substrate conduction test in a state in which the lower package 2 is being displaced to one side over the movable pedestal 15, a clearance in the pocket portion 15d of the solder ball 7 can be eliminated, and the positioning accuracy between the first contact pin 14a as well as second contact pin 13a and the wiring substrate 5 in the substrate conduction test can be further improved.

As described above, the present invention made by the present inventor has been described specifically based on the embodiments. However, the present invention is not limited to the embodiments and various modifications are possible without departing from the gist of the invention.

In the above embodiments, although a case where the semiconductor device is the BGA-type lower package 2 has been described, the semiconductor device may be an LGA-type lower package 2. In this case, the second contact pin 13a arranged on the lower surface 5b side of the wiring substrate 5 in the socket 12 is brought into contact with the LGA land 5h (see FIG. 5) on the lower surface 5b of the wiring substrate 5, and then, the substrate conduction test is performed.

The present invention is suitable for a method of inspecting an electronic device which is performed when the electronic device is being inserted into a socket.

What is claimed is:

1. A method of manufacturing a semiconductor device, comprising the steps of:
   (a) assembling a semiconductor device by mounting a semiconductor chip over a front-side surface of a wiring substrate including a front-side pad on the front-side surface and a back-side pad on a back-side surface, the front-side pad and the back-side pad being electrically connected to each other, and also mounting a solder ball on the back-side pad;
   (b) inserting the semiconductor device into a socket to bring first and second contact pins provided inside the socket into contact with the front-side pad and the solder ball, respectively; and
   (c) performing a conduction test of the wiring substrate via the first and second contact pins,
   wherein the socket includes a movable pedestal for receiving the semiconductor device on, a base section arranged under the movable pedestal, and a lid section which is arranged over the semiconductor device during the conduction test,
   wherein the lid section includes a positioning pin and the first contact pin contacting the front-side pad,
   wherein the base section includes the second contact pin contacting the solder ball, and a positioning member engaging with the positioning pin,
   wherein the movable pedestal engages the positioning member, and is provided movably along an extending direction of the first and second contact pins under a guidance of the positioning member, and
   wherein the conduction test of the step (c), when the movable pedestal is being positioned relative to an arrangement direction of the first and second contact pins by the positioning member, is performed while bringing the first contact pin into contact with the front-side pad and also causing the second contact pin to penetrate the base section and contact the solder ball.

2. The method of manufacturing a semiconductor device according to claim 1,
   wherein the conduction test of the step (c) is performed in a state in which the semiconductor device is being displaced to one side relative to the arrangement direction over the movable pedestal.

3. The method of manufacturing a semiconductor device according to claim 2,
   wherein in the one-sided displacement, the solder ball is caused to bump against an inner wall of a concave portion provided in the movable pedestal.

4. The method of manufacturing a semiconductor device according to claim 2,
   wherein the one-sided displacement is performed by pushing a side surface of the wiring substrate.

5. The method of manufacturing a semiconductor device according to claim 1,
   wherein in the conduction test of the step (c), a wiring resistance between the front-side pad and the back-side pad is measured.

6. The method of manufacturing a semiconductor device according to claim 5,
   wherein the measurement of the wiring resistance is performed on all the solder balls.

7. The method of manufacturing a semiconductor device according to claim 1, further comprising the step of, after the step (c), performing a product characteristic inspection on a non-defective product selected by the conduction test.

8. The method of manufacturing a semiconductor device according to claim 1,
   wherein positioning in an arrangement direction of the first and second contact pins of the movable pedestal is performed by the positioning member being fitted into a through-hole provided in the movable pedestal, and
   wherein the movable pedestal slides with the positioning member.

9. The method of manufacturing a semiconductor device according to claim 1,
   wherein the movable pedestal is attached to the base section via an elastic member.

10. The method of manufacturing a semiconductor device according to claim 1,
    wherein the step (a) includes the steps of:
    (a1) providing the wiring substrate including the front-side pad and the back-side pad;
    (a2) electrically connecting the semiconductor chip and a chip bonding pad electrically connected to the front-side pad, to each other by mounting the semiconductor chip onto the chip bonding pad; and
    (a3) electrically connecting the back-side pad and the solder ball to each other by mounting the solder ball onto the back-side pad and performing a high temperature reflow.

11. The method of manufacturing a semiconductor device according to claim 10,
   wherein in the step (a2), a projection electrode provided on a surface of an electrode pad of the semiconductor chip and the chip bonding pad are electrically connected to each other.

12. The method of manufacturing a semiconductor device according to claim 11,
   wherein the connection between the projection electrode and the chip bonding pad is performed by heating the semiconductor chip and melting a solder provided in the chip bonding pad in advance.

* * * * *